US012787391B2

(12) United States Patent
Tanamoto

(10) Patent No.: US 12,787,391 B2
(45) Date of Patent: Nov. 3, 2026

(54) QUANTUM DEVICE

(71) Applicant: Teikyo University, Tokyo (JP)

(72) Inventor: Tetsufumi Tanamoto, Utsunomiya (JP)

(73) Assignee: Teikyo University, Tokyo (JP)

( * ) Notice: Subject to any disclaimer, the term of this patent is extended or adjusted under 35 U.S.C. 154(b) by 1009 days.

(21) Appl. No.: 17/928,807

(22) PCT Filed: May 28, 2021

(86) PCT No.: PCT/JP2021/020364

§ 371 (c)(1),
(2) Date: Nov. 30, 2022

(87) PCT Pub. No.: WO2021/251175

PCT Pub. Date: Dec. 16, 2021

(65) Prior Publication Data

US 2023/0231016 A1 Jul. 20, 2023

(30) Foreign Application Priority Data

Jun. 12, 2020 (JP) ................................ 2020-102530

(51) Int. Cl.
*H10D 62/81* (2025.01)
*H10D 62/10* (2025.01)
*H10F 77/14* (2025.01)

(52) U.S. Cl.
CPC ......... *H10D 62/813* (2025.01); *H10D 62/119* (2025.01); *H10F 77/1433* (2025.01)

(58) Field of Classification Search
CPC . H10F 77/1433; H10D 48/40; H10D 48/3835
See application file for complete search history.

(56) References Cited

U.S. PATENT DOCUMENTS

| | | | | |
|---|---|---|---|---|
| 6,103,600 | A | 8/2000 | Ueda et al. | |
| 10,482,388 | B1 | 11/2019 | Jock et al. | |
| 11,387,324 | B1 * | 7/2022 | Holmes | H10D 62/815 |
| 2005/0026411 | A1 | 2/2005 | Tanamoto et al. | |
| 2005/0051843 | A1 | 3/2005 | Inaba | |
| 2005/0184285 | A1 | 8/2005 | Friesen et al. | |
| 2008/0237697 | A1 | 10/2008 | Shimizu et al. | |
| 2012/0161202 | A1 | 6/2012 | Cappellani et al. | |
| 2019/0194016 | A1 | 6/2019 | Roberts et al. | |

(Continued)

FOREIGN PATENT DOCUMENTS

| | | | |
|---|---|---|---|
| CN | 109791924 | A | 5/2019 |
| JP | 11-97667 | A | 4/1999 |
| JP | 11-150261 | A | 6/1999 |

(Continued)

OTHER PUBLICATIONS

Office Action dated Dec. 20, 2025 issued in corresponding Chinese Application No. 202180040578.8.

(Continued)

*Primary Examiner* — Raj R Gupta
(74) *Attorney, Agent, or Firm* — Blank Rome LLP

(57) ABSTRACT

A quantum device includes a transistor structure section having a source, a drain, and a gate, one or more quantum dot structure sections in which a charge is localizable, and a quantum bit control current line configured to change a state of the charge in the quantum dot structure section.

10 Claims, 23 Drawing Sheets

(56) References Cited

U.S. PATENT DOCUMENTS

| | | | | |
|---|---|---|---|---|
| 2019/0393328 | A1 | 12/2019 | Leipold et al. | |
| 2020/0312989 | A1* | 10/2020 | George | B82Y 10/00 |

FOREIGN PATENT DOCUMENTS

| | | | |
|---|---|---|---|
| JP | 2005-57012 | A | 3/2005 |
| JP | 2005-85960 | A | 3/2005 |
| JP | 2006-210620 | A | 8/2006 |
| JP | 2008-244243 | A | 10/2008 |
| JP | 2011-512525 | A | 4/2011 |
| JP | 2019-537239 | A | 12/2019 |
| WO | WO 2009/100483 | A1 | 8/2009 |
| WO | 2018/063202 | A1 | 4/2018 |
| WO | WO 2018/063204 | A1 | 4/2018 |
| WO | WO 2018/063270 | A1 | 4/2018 |
| WO | WO 2019/004990 | A1 | 1/2019 |

OTHER PUBLICATIONS

M. Veldhorst et al., "A Two-Qubit Logic Gate in Silicon." Nature, vol. 526, pp. 410-414 (2015).
F. Arute et al., "Quantum Supremacy Using a Programmable Superconducting Processor." Nature, vol. 574, pp. 505-510 (2011).
M.W. Johnson et al., "Quantum Annealing with Manufactured Spins." Nature, vol. 473, pp. 194-198 (2011).
G. Burkard et al., "Coupled Quantum Dots as Quantum Gates." Physical Review B, vol. 59, No. 3, pp. 2070-2078 (1999).
T. Tanamoto et al., "Calculation of a Capacitively-coupled Floating Gate Array Toward Quantum Annealing Machine." Journal of Applied Physics, vol. 124, pp. 154301-1-154301-13 (2018).
R. Li et al., "A Crossbar Network for Silicon Quantum Dot Qubits." Science Advances, vol. 4, pp. 1-10 (2018).
R. Xia et al., "Electronic Structure Calculations and the Ising Hamiltonian." J. Phys. Chem. B., vol. 122, No. 13, pp. 3384-3395 (2018).
Y. Rikitake et al., "Decoherence of Localized Spins Interacting Via RKKY Interaction." Physical Review B, vol. 72, pp. 033308-1-033308-4 (2005).
International Search Report, Int'l Application No. PCT/JP2021/020364, Aug. 10, 2021.
Extended European Search Report dated Sep. 13, 2024 issued in EP Application No. 21821855.0.
H. A. Nguyen et al., "Ultra-low power optical transistor using a single quantum dot embedded in a photonic wire", IEEE/Ultra-low power optical, Oct. 30, 2017.
Office Action/Search Report issued in corresponding Chinese Patent Application No. 202180040578.8 dated Apr. 9, 2026.

* cited by examiner

QUANTUM DEVICE

Priority is claimed on Japanese Patent Application No. 2020-102530, filed Jun. 12, 2020, the content of which is incorporated herein by reference.

BACKGROUND ART

The present invention relates to a quantum device.

Research and development on quantum computers and quantum annealing machines are progressing. For example, Non-Patent Documents 1 and 2 report examples in which 50 or more quantum bits using a superconductor are produced. Additionally, Non-Patent Document 3 is an experimental example of a quantum annealing machine, and this technology has already been commercialized.

As the technology on the quantum computers, the development of related technology using superconductors is progressing as in this example. This is because the time (coherence time) required to maintain the quantum state is experimentally and relatively easily realized in a superconducting state without resistance. However, in superconducting devices, it is difficult to perform integration in the related art.

Meanwhile, current computers are made of semiconductors such as silicon. The gate length of transistors currently used in smartphones and the like is already 15 nm or less, and a technology roadmap is being created down to 5 nm or less in the future. If quantum bits can be made with semiconductor technology, it will be possible to utilize the technology on integration that has been accumulated over decades so far. Thus, it is expected to realize quantum computer-related technology in which high reliability and versatility are combined together.

Specifically, a method using spins of electrons or holes (Non-Patent Document 4) and a method using the amount of charges itself (Non-Patent Document 5) have been proposed to produce quantum bits using semiconductors.

FIG. 22 shows a schematic diagram of a simple spin quantum bit. In the spin quantum bit, an upward spin state $|\uparrow>$ and a downward spin state $|\downarrow>$ are determined with respect to an external magnetic field, and any rotation around this axis also realizes a general quantum superposition state $|\psi>=a|\uparrow>+b|\downarrow>$(a, b are optional complex numbers). However, since it is generally difficult to maintain the coherence of spin and charge states, the technology in this field is desired to develop further from now compared to superconduction.

CITATION LIST

Patent Document 1: U.S. Patent Application, Publication No. 2019/0393328

Patent Document 2: Japanese Patent Application Publication No. 2011-512525 A

Non-Patent Document 1: M. Veldhorst et al., "A two-qubit logic gate in silicon", Nature, Vol. 526, pp. 410-414 (2015).

Non-Patent Document 2: F. Arute, "Quantum supremacy using a programmable superconducting processor", Nature, Vol. 574, pp. 505-510 (2019).

Non-Patent Document 3: M. W. Johnson et al., "Quantum annealing with manufactured spins", Nature, Vol. 473, pp. 194-198 (2011).

Non-Patent Document 4: G. Burkard et al., "Coupled quantum dots as quantum gates", Physical Review B59, p. 2070 (1999).

Non-Patent Document 5: T. Tanamoto et al., "Calculation of a capacitively-coupled floating gate array toward quantum annealing machine", Journal of Applied Physics, Vol. 124, 154301 (2018).

Non-Patent Document 6: R. Li et al., "A crossbar network for silicon quantum dot qubits", Science Advances, Vol. 4, No. 7 (2018).

Non-Patent Document 7: R. Xia et al., "Electronic Structure Calculations and the Ising Hamiltonian", J. Phys. Chem. B., Vol. 122, No. 13, pp. 3384-3395 (2018).

Non-Patent Document 8: Y. Rikitake et al., "Decoherence of localized spins interacting via RKKY interaction", Phys. Rev. B. 72, pp. 033308 (2005).

SUMMARY OF THE INVENTION

An object of the present invention is to provide a quantum device serving as a basic constituent unit of a quantum computer or a quantum annealing machine by extending a related-art transistor.

Specifically, an object of the present invention is to provide a quantum device that can be manufactured in current factory facilities while utilizing related-art transistor structures as much as possible and that can perform measurement easily.

One aspect of the present invention is a quantum device including a transistor structure section having a source, a drain, and a gate; one or more quantum dot structure sections in which a charge is localizable; and a quantum bit control current line configured to change a state of the charge in the quantum dot structure section, in which the length of the gate is 30 nm or less.

One aspect of the present invention is a quantum device including a transistor structure section having a source, a drain, and a gate and having a plurality of channel structure parts between the source and the drain; and one or more quantum dot structure sections, in which the quantum dot structure section is sandwiched between the plurality of channel structure parts, an electron or a hole is storable in the quantum dot structure section, and the quantum device further includes a quantum bit control current line through which a quantum bit control current flows, which generates a magnetic field that controls the spin state of the electron or the hole.

In the quantum device of the one aspect of the present invention, the transistor structure section having the plurality of channel structure parts sandwiching the quantum dot structure section may be a multi-gate transistor.

In the quantum device according to one aspect of the present invention, the gate may be disposed on any one of an upper portion, a lateral side, and a lower side of the channel structure part.

In the quantum device of the one aspect of the present invention, the transistor structure section may have two or more gates as the gate.

In the quantum device according to one aspect of the present invention, the transistor structure section may have a substrate portion, and the quantum bit control current line may be disposed at a position closer to the substrate portion than the quantum dot structure section.

In the quantum device of one aspect of the present invention, the quantum device may further include at least a first quantum dot structure section and a second quantum dot structure section as the quantum dot structure section, the plurality of channel structure parts may include a first channel structure part disposed between the first quantum dot structure section and the second quantum dot structure section, and a magnetic field generated by allowing the quantum bit control current to flow through the quantum bit control current line may be utilized to change a quantum state of a charge spin in the first quantum dot structure section to adopt an interaction between the charge spin in the first quantum dot structure section and a charge spin in the second quantum dot structure section as an indirect interaction via a charge in the first channel structure part.

In the quantum device of the one aspect of the present invention, the quantum device may have a manipulation mode, and in the manipulation mode, the current of the quantum bit control current line may be set to a non-zero value, the voltage of the gate may be set to a value greater than zero, a voltage of the source may be set to a non-zero value, and a voltage of the drain may be set to a non-zero value, a magnetic field generated by at least the quantum bit control current line may be set to a non-zero value, and a Ruderman-Kittel-Kasuya-Yosida (RKKY) interaction is utilized.

In the quantum device of the one aspect of the present invention, the quantum device may have a measurement mode, and in the measurement mode, a main current of the quantum bit control current line may be set to zero, the voltage of the gate may be set to a value greater than zero, the voltage of the source may be set to a value less than the voltage of the drain, and a state of a charge spin in the quantum dot structure section may be estimated on the basis of a current between the source and the drain. In addition, for example, when a high frequency continues to be applied, the main current of the quantum bit control current line may take a non-zero value.

In the quantum device of the one aspect of the present invention, a fact that a charge spin in the quantum dot structure section has a different energy level depending on a state of a charge in the quantum dot structure section may be utilized, and a state of the charge spin in the quantum dot structure section sandwiched between a first channel structure part and a second channel structure part included in the plurality of channel structure parts may be estimated on the basis of a measured value of a current between the source and the drain, which flows through the first channel structure part.

In the quantum device of the one aspect of the present invention, the quantum dot structure section may be naturally or artificially produced, and an energy level of the quantum dot structure section is a trap level.

Advantageous Effects of Invention

According to the present invention, it is possible to provide the quantum device that can be manufactured in current factory facilities while utilizing related-art transistor structures as much as possible and that can perform measurement easily.

BRIEF DESCRIPTION OF THE DRAWINGS

FIG. 8 is a diagram showing simulation results and the like.

DETAILED DESCRIPTION OF THE PREFERRED EMBODIMENTS

Figure 1:
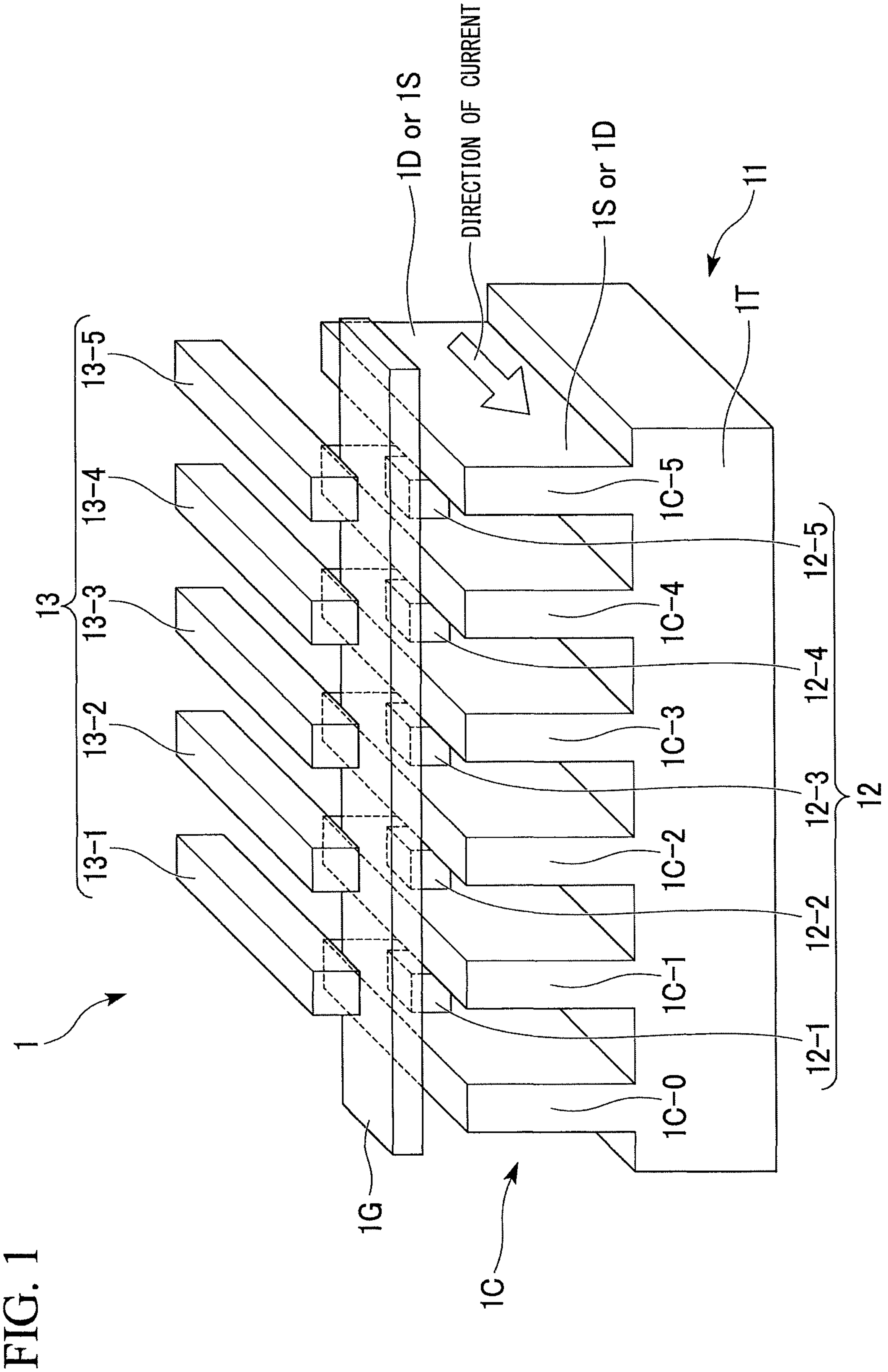
FIG. 1 is a diagram showing an example of a basic structure of a quantum device of a first embodiment.

Before describing embodiments of a quantum device of the present invention, related art relating to the structure, measurement, and the like of the quantum device will be described.

Related Art Relating to Structure

Development has been slow for quantum bits using electron spins or hole spins. Since the interaction between the spins is short-range, it is necessary to reduce the distance between the spins. On the other hand, in a structure that generates a magnetic field required to change the states of the spins, quantum bits cannot be extremely brought close to each other. Accordingly, experiments with up to two quantum bits have been possible, but experiments with three or more quantum bits have not progressed. For example, in the structure of Non-Patent Document 1, it is difficult to bring three or more quantum bits closer to each other. This is an obstacle in integrating a large number of quantum bits.

Related Art Relating to Measurement

Additionally, quantum devices using spins also had a difficult problem in a measurement process for spin states.

Electronic circuits are required to measure the spin states. Although the spins have a magnetic property, normal electronic circuits do not have a mechanism that directly measures the quantity relating to magnetization. Therefore, it was necessary to convert the magnetic property into a charge state.

Specifically, there is a method or the like referred to as spin blockade. This method is a method utilizing the fact that when one quantum dot is added and the direction of an electron spin inside is fixed, electrons are blocked or flow depending on whether the spin coming from the quantum bit is upward or downward. This is on the basis of the Pauli's exclusion principle, which states that two electrons with the same spin directions cannot occupy the same energy level.

In related-art methods, extra electrodes and current lines to measure this spin blockade are required. For example, in Non-Patent Document 1, five or more electrodes are required to measure two quantum bits, which is also not preferable in integrating the quantum bits.

Manufacturing Cost

Moreover, in novel device structures, major challenges remain in production. In Non-Patent Document 1, Non-Patent Document 6, or the like, novel hyperfine structures are required. The gate length of silicon transistors used in current smartphones is 16 nm or less, and the chip production costs more than 1 trillion yen. About 400 billion yen is required in even 40 nm. Quantum bits, which are new fine structures, are expected to require huge development costs, which is a major obstacle to industrialization. Therefore, it is desirable to use the related-art structures as much as possible.

Quantum Annealing Technology

Quantum annealing technology is related to artificial intelligence, and research has been developing as means for solving optimization problems. First, Nishimori et al. developed a physical theory and accelerated their research with the development and sale of D-wave in Canada (Non-Patent Document 3). Quantum annealing is a quantum extension of classical annealing calculation techniques and is expected to shorten calculation time for so-called NP-hard problems such as the travel salesman problem. First, problems are mapped to the Ising Hamiltonian. At this point, it is represented as the classical Ising Hamiltonian by the following Formula (1).

$$H = \sum_{i<j} J_{ij} s_i^z s_j^z + \sum_i h_i s_i^z \tag{1}$$

In Formula (1), a first term is an interaction term between spins, and a second term is a magnetic field term (Zeeman term). A variable $s_i$ is a binary value ($s_i = \pm 1$).

In a model of a quantum annealing machine, a tunneling term is added, as in Formula (2).

$$H = \sum_{i<j} J_{ij} \sigma_i^z \sigma_j^z + \sum_i [h_i \sigma_i^z + \Delta_i(t) \sigma_i^x] \tag{2}$$

In the case of the quantum annealing machine, variables are represented by Pauli matrices σx and σz instead of binary values. A final tunneling term is adjusted according to the schedule such that $\Delta(t \to \infty) \to 0$ is established, and a calculation result is obtained. Since Formula (2) of the Hamiltonian has a simple form, the formula has been discussed in various physical systems, but in order to utilize the formula as the quantum annealing machine, it is necessary to be able to freely process the Hamiltonian. That is, it is necessary to have a configuration in which an interaction $J_{ij}$ and a magnetic field term $h_j$ can be freely changed.

Additionally, in a case where an interaction portion of the Hamiltonian is not the Ising type as in Formula (2) but the Heisenberg type as in Formula (3), as described in Non-Patent Document 7, the interaction portion can be mapped to a normal Ising Hamiltonian. The interaction portion can also be used for quantum chemical calculations as described in Non-Patent Document 7.

$$H = \sum_{i<j} J_{ij} \vec{S}_i \cdot \vec{S}_j + \sum_i [h_z S_z + \Delta_i(t) S_x] \tag{3}$$

Embodiments of the quantum device of the present invention will be described below.

First Embodiment

FIG. 1 is a diagram showing an example of a basic structure of a quantum device 1 of a first embodiment.

In the example shown in FIG. 1, the quantum device 1 of the first embodiment uses, for example, a fin field-effect transistor (FINFET) structure as the basic structure. The quantum device 1 includes a transistor structure section 11 (for example a FINFET structure configured similarly to a normal FINFET structure), a quantum dot structure section 12 in which charges are localizable, and a quantum bit control current line 13.

The transistor structure section 11 has a substrate portion 1T, and a FIN-shaped portion extending upward in FIG. 1 from the substrate portion 1T. Additionally, the transistor structure section 11 has a source is, a drain 1D, and a gate 1G. The transistor structure section 11 has a channel structure part 1C between the source and the drain through which current flows in a direction indicated by an arrow in FIG. 1. The length of the gate 1G is 30 nm or less.

In the example shown in FIG. 1, six channel structure parts 1C-0, 1C-1, 1C-2, 1C-3, 1C-4, and 1C-5 are included in the channel structure part 1C.

In another example, any number of (but a plurality of) channel structure parts other than six may be included in the channel structure part 1C.

In the example shown in FIG. 1, electrons or holes can be stored in the quantum dot structure section 12. As a material for the quantum dot structure section 12, for example, a material such as polysilicon that can store charges are used. Additionally, the quantum dot structure section 12 may be artificially produced or naturally produced by defects or the like, and the energy level of the quantum dot structure section 12 may be a trap level.

In the example shown in FIG. 1, the quantum dot structure section 12 includes five quantum dot structure sections 12-1, 12-2, 12-3, 12-4, and 12-5.

In other examples, any number of quantum dot structure sections other than five may be included in quantum dot structure section 12.

In the example shown in FIG. 1, the quantum dot structure section 12-1 is sandwiched between the channel structure parts 1C-0 and 1C-1, the quantum dot structure section 12-2 is sandwiched between the channel structure parts 1C-1 and 1C-2, the quantum dot structure section 12-3 is sandwiched between the channel structure parts 1C-2 and 1C-3, the quantum dot structure section 12-4 is sandwiched between the channel structure parts 1C-3 and 1C-4, and the quantum dot structure section 12-5 is sandwiched between channel structure parts 1C-4 and 1C-5.

The quantum bit control current line 13 is formed of, for example, Cu, and can change the state of charges in the quantum dot structure section 12. Specifically, a quantum bit control current that generates a magnetic field for controlling electrons or holes flows through the quantum bit control current line 13.

In the example shown in FIG. 1, five quantum bit control current lines 13-1, 13-2, 13-3, 13-4, and 13-5 corresponding to the five quantum dot structure sections 12-1, 12-2, 12-3, 12-4, and 12-5 are included in the quantum bit control current line 13. The quantum bit control current line 13-1 mainly changes the state of charges in the quantum dot structure section 12-1, the quantum bit control current line 13-2 mainly changes the state of charges in the quantum dot structure section 12-2, the quantum bit control current line 13-3 mainly changes the state of charges in the quantum dot structure section 12-3, the quantum bit control current line 13-4 mainly changes the state of charges in the quantum dot structure section 12-4, and the quantum bit control current line 13-5 mainly changes the state of charges in the quantum dot structure section 12-5.

Figure 19:
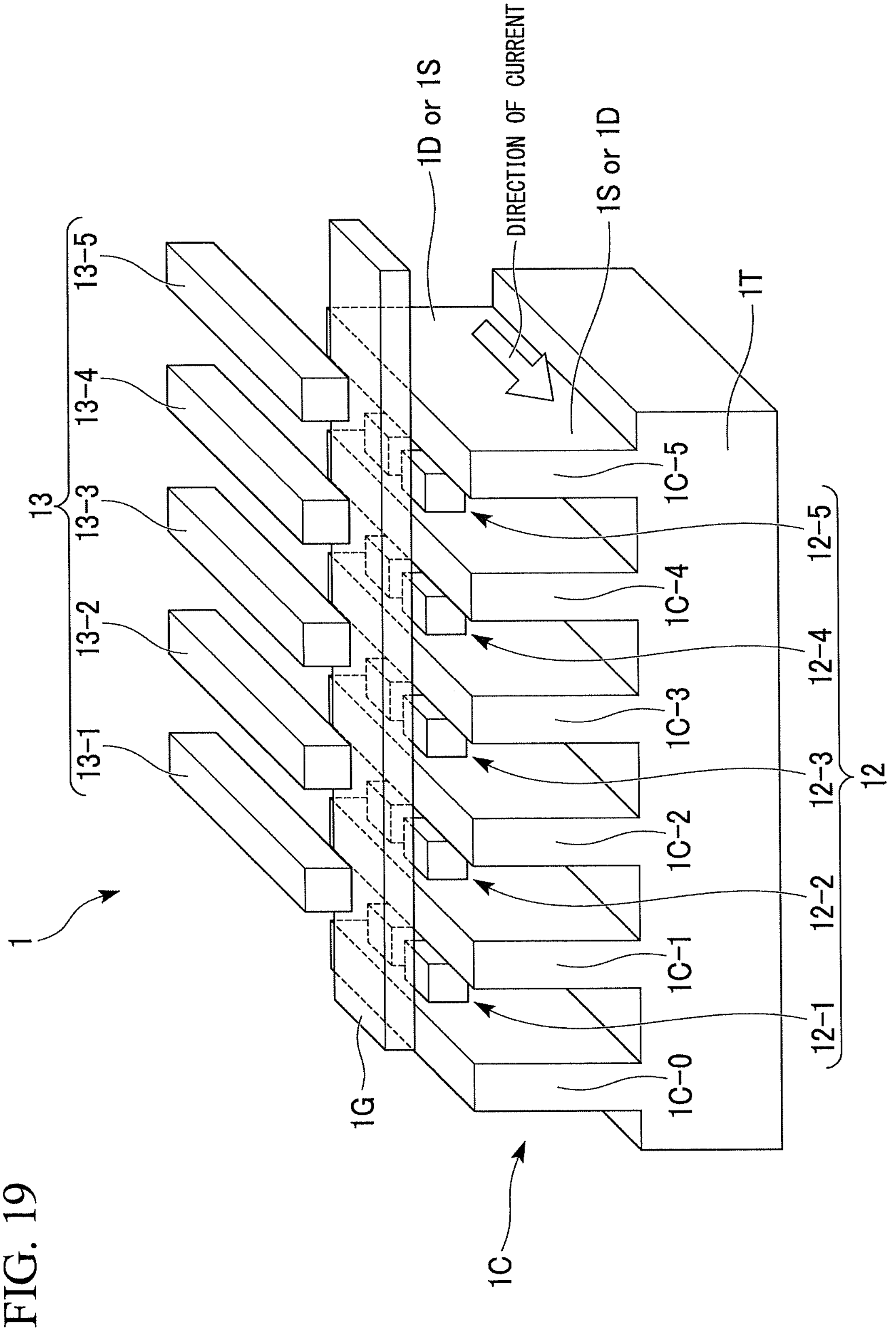
FIG. 19 is a diagram showing an example of a quantum device according to a twelfth embodiment.

In another example, a plurality of quantum dot structure sections 12 may be sandwiched between two channel structure parts 1C, and the state of charges in the plurality of quantum dot structure sections 12 sandwiched between the two channel structure parts 1C may be changed by a single quantum bit control current line 13 (see FIG. 19).

In the example shown in FIG. 1, a portion where no constituent elements are described in FIG. 1 (that is, a space portion in FIG. 1) is made of an insulator such as $SiO_2$.

In the example shown in FIG. 1, the gate 1G is disposed at an upper portion of the channel structure part 1C, but in other examples the gate 1G may be disposed either a lateral side or a lower side of the channel structure part 1C.

In the example shown in FIG. 1, a quantum dot is provided into which a charge spin, which is a quantum bit, is inserted, or sandwiched between channel structures. The countable electron or hole spins stored in the quantum dot are used as a quantum bit, which is a basic unit of the quantum device 1. A gate electrode (gate 1G) is installed in a conduction channel between the source and the drain via an insulating film. A wiring line (quantum bit control current line 13) that controls each quantum bit is provided at an upper portion of the gate electrode structure through the insulating film. Additionally, charges mean electrons or holes. In the case of holes, the polarity of an electrode applied is opposite to that of electrons. However, since the explanation is the same, charges will be mainly described below.

The spins of the charges become the quantum bit. The directions of the spins of the charges correspond to quantum states (|↑> and |↓>). An external magnetic field changes the quantum states of the charge spins. Two types of external magnetic fields are used: a static magnetic field applied to the entire quantum device 1 and a dynamic magnetic field generated by allowing a current to flow through the quantum bit control current line 13. When a static external magnetic field is applied, the spins cause Zeeman separation depending on the directions thereof. For example, when an upward magnetic field is applied, the spins tend to be aligned upward along the magnetic field. Therefore, the energy of an upward spin is low, and the energy of a downward spin is high. Accordingly, it is possible to distinguish between the spin states. A magnetic field of, for example, about 1 T (Tesla) to several T is used experimentally. The magnitude of the dynamic magnetic field can be estimated using the Ampere's law.

In the example shown in FIG. 1, the quantum dot structure sections 12 (quantum dot or trap levels) are embedded between the channel structure parts 1C (between the channel structure parts 1C-0 and 1C-1, between the channel structure parts. 1C-1 and 1C-2, between the channel structure parts 1C-2 and 1C-3, between the channel structure parts 1C-3 and 1C-4, and between the channel structure parts 1C-4 and 1C-5) of the FINFET structure (transistor structure section 11).

As a method for producing the quantum device 1 shown in FIG. 1, in a case where the quantum dot structure section 12 is a quantum dot, after a related-art FIN structure (FIN-shaped portion) is formed on a substrate (substrate portion 1T) such as silicon, the quantum dot structure section 12 is generated by embedding etching of polysilicon or the like. Patterning technology using a Side-wall, for example, is used to generate the quantum dot structure section.

In a case where the trap level is used as the quantum dot structure section 12, after the related-art FIN structure (FIN-shaped portion) is generated on a substrate (substrate portion 1T) such as silicon and before a gate electrode material for the gate 1G is implanted between the FIN structures (FIN-shaped portions), an interlayer dielectric layer is generated, and a spontaneously generated trap is utilized as the quantum dot structure section 12.

Alternatively, the quantum dot structure section 12 is generated by directly implanting ions of P (phosphorus), B (boron), and the like between the FIN structures (FIN-shaped portions). After the generation of the gate insulating film, a gate electrode (gate 1G) common to the FIN structures (FIN-shaped portions) is generated. After the generation of the interlayer dielectric layer, the quantum bit control current line 13 (current line structure) for controlling the dynamic magnetic field is formed. The process after this is the same as the normal FINFET structure production process.

Figure 2:
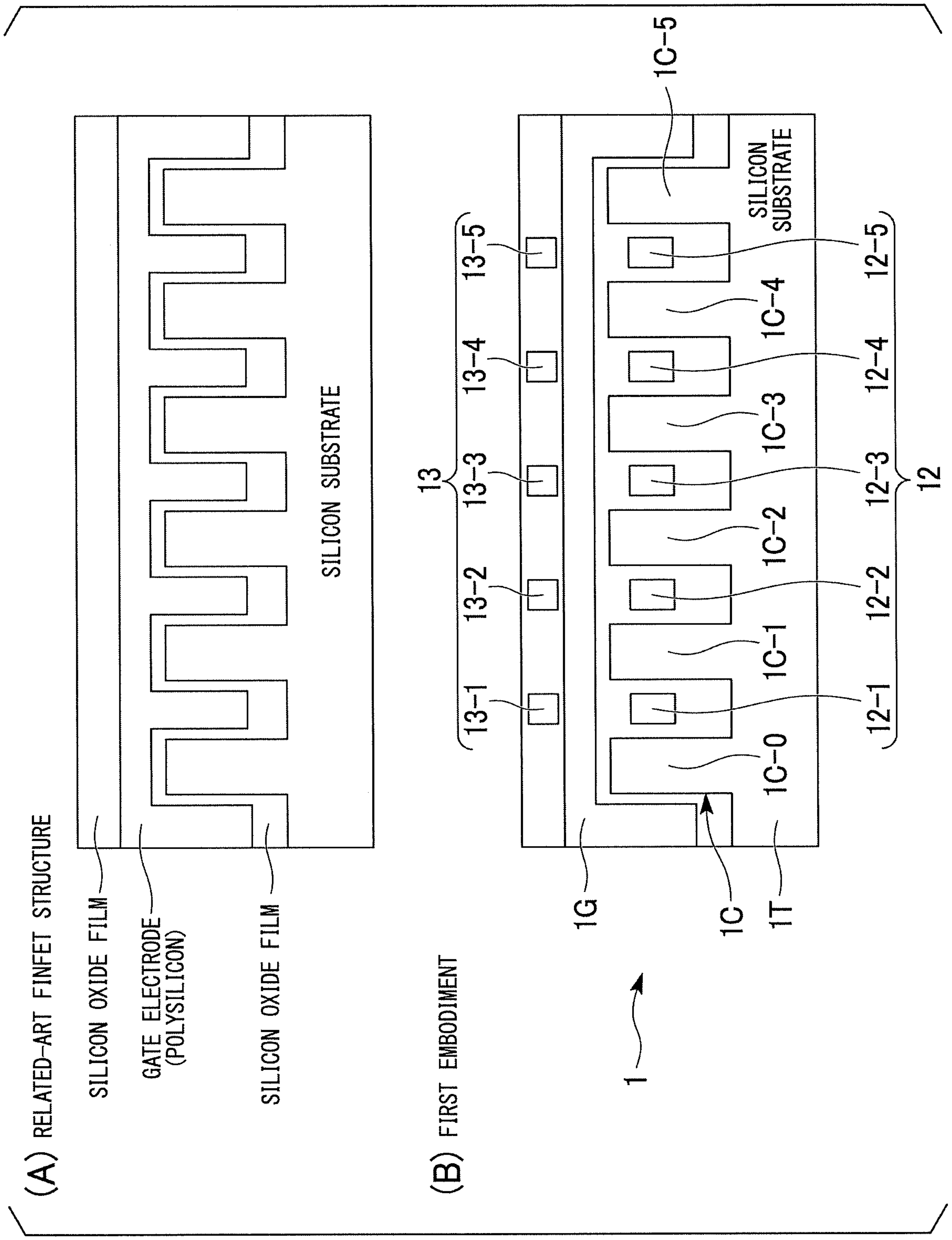
FIG. 2 is a sectional view showing a difference between a related-art FINFET structure and the quantum device 1 of the first embodiment.

FIG. 2 is a sectional view showing a difference between a related-art FINFET structure and the quantum device 1 of the first embodiment. (A) of FIG. 2 is a sectional view of the related-art FINFET structure. Here, the number of FINs (FIN-shaped portions) is six, but the number of FINs may be larger or smaller. (B) of FIG. 2 shows a sectional view of the quantum device 1 of the first embodiment. A difference from (A) (related-art example) of FIG. 2 is that the quantum dot structure section 12 (even a trap level may be possible) that holds charge spins that become a quantum bit between the FINs (FIN-shaped portions) (the channel structure parts 1C) and the quantum bit control current line 13 that generates a magnetic field at an upper portion of a common electrode (gate 1G) are used. Since the quantum bit control current line 13 change the charge spin states in the quantum dot structure section 12, the number thereof is preferably equal to the number of quantum dot structure sections 12, but may be slightly less. Hereinafter, the expression "quantum dot structure section 12" is used including the trap level.

In the example shown in (B) of FIG. 2, the transistor structure section 11 is a tri-gate (multi-gate) transistor because the gate 1G is located on the upper side and lateral sides (left side and right side) of the channel structure part 1C.

Figure 23:
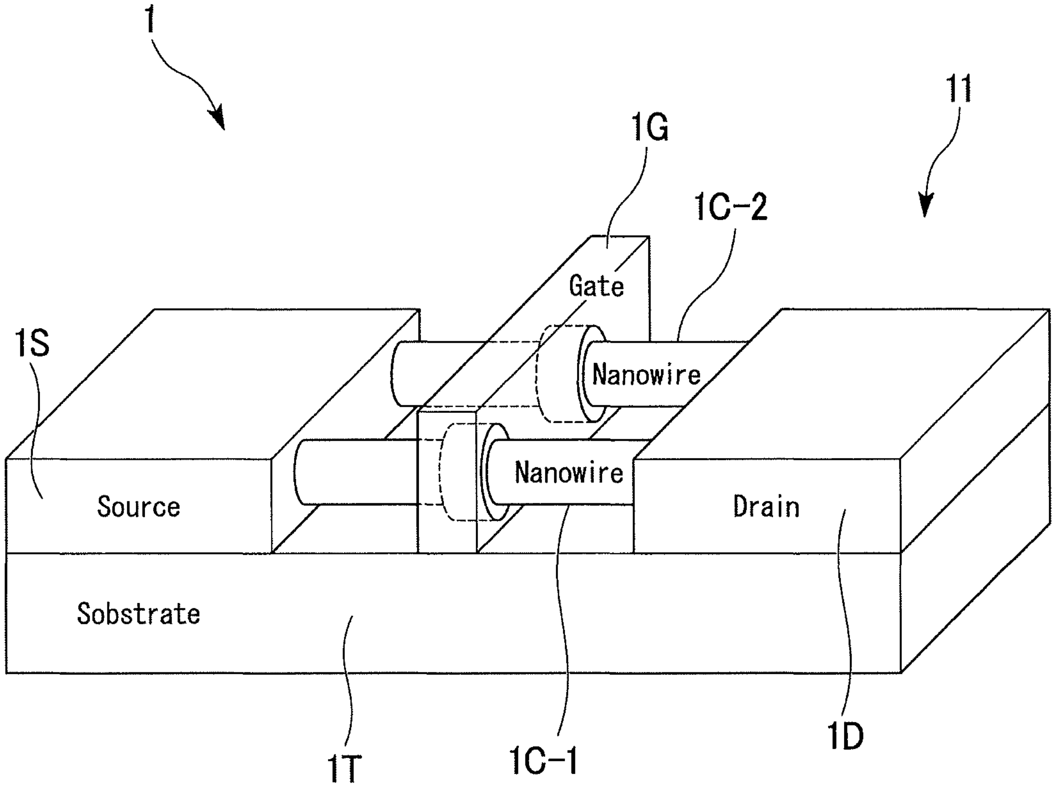
FIG. 23 is a diagram showing an example of a nanowire transistor to which the quantum device of the present invention is applicable.

Although the present invention mainly shows a case where the FIN structure has a certain height, the present invention is also applied to a nanowire transistor as shown in FIG. 23.

FIG. 23 is a diagram showing an example of the nanowire transistor to which the quantum device 1 of the present invention is applicable.

In the example shown in FIG. 23, the quantum device 1 includes the transistor structure section 11 having the source 1S, the drain 1D and the gate 1G, and one or more quantum dot structure sections (not shown in FIG. 23) in which charges are localizable, and a quantum bit control current line (not shown in FIG. 23) that can change the states of charges in the quantum dot structure section.

Specifically, in the example shown in FIG. 23, the quantum device 1 has the source 1S, the drain 1D, the gate 1G and includes the transistor structure section 11 having a plurality of channel structure parts 1C-1 and 1C-2 between the source and the drain, and a quantum dot structure section (not shown in FIG. 23) sandwiched between the channel structure parts 1C-1 and 1C-2. Electrons or holes can be stored in the quantum dot structure section. The quantum device 1 further includes a quantum bit control current line (not shown in FIG. 23) through which a quantum bit control current for generating a magnetic field for controlling electrons or holes flows.

In the example shown in FIG. 23, the transistor structure section 11 is a full-circumference transistor because the gate 1G can surround all sides of a nanowire.

Second Embodiment

A second embodiment of the quantum device of the present invention will be described below.

The quantum device 1 of the second embodiment is configured in the same manner as the quantum device 1 of the above-described first embodiment, except for points described below. Therefore, according to the quantum device 1 of the second embodiment, the same effects as those of the quantum device 1 of the above-described first embodiment can be obtained except for the points described below.

Figure 3:
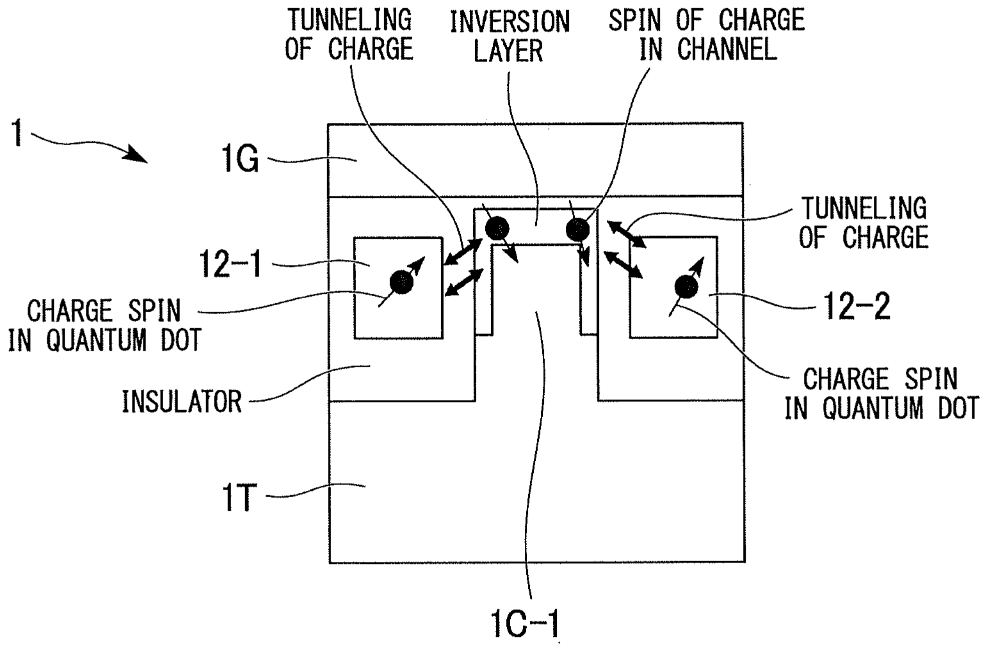
FIG. 3 is a diagram showing an example of a part of a quantum device of a second embodiment.

FIG. 3 is a diagram showing an example of a part of the quantum device 1 of the second embodiment.

In the example shown in FIG. 3, the quantum device 1 includes at least the quantum dot structure sections 124 and 12-2 as the quantum dot structure section 12. Additionally, the channel structure part 1C includes the channel structure part 1C-1 disposed between the quantum dot structure sections 12-1 and 12-2.

In the FINFET structure, when a voltage is applied to the gate 1G, charges gather in the channel structure part 1C-1 (charge conduction path) between the source and the drain due to the field effect of the gate 1G to form an inversion layer. In the interaction between the quantum bits (interaction between the quantum dot structure sections 12-1 and 12-2), charges gather in a portion near the gate 1G in the channel structure part 1C-1 of the FINFET structure to form an inversion layer.

The interaction between the quantum bits (interaction between the quantum dot structure sections 12-1 and 12-2) utilizes charges gathered near the surface in this channel. An insulator between the quantum dot structure section 12-1 and the channel structure part 1C-1 and an insulator between the quantum dot structure section 12-2 and the channel structure part 1C-1 are sufficiently thin. For example, in a case where the insulator is a silicon oxide film, the thickness of the insulator is 2 nm or less. In this case, quantum mechanical tunneling occurs between the quantum dot structure section 12-1 and the channel structure part 1C-1 and between the quantum dot structure section 12-2 and the channel structure part 1C-1. Through the tunneling phenomenon, charge spins in the two quantum dot structure sections 12-1 and 12-2 on both sides of the channel structure part 1C-1 form an interaction. This is referred to as a Ruderman Kittel Kasuya Yosida (RKKY) interaction. The relationship between the RKKY interaction $H_{RKKY}$, a spin operator $S_1$ of the quantum dot structure section 12-1, and a spin operator $S_2$ of the quantum dot structure section 12-2 is represented by the following Formula (4).

$$H_{RKKY} = J^{RKKY} S_1 \cdot S_2, \tag{4}$$

Tunneling through a thin film occurs between the spins in the quantum dot structure section 12-1 and the charges in the conduction channel (channel structure part 1C-1). Additionally, the tunneling through the thin film also occurs between the spins in the quantum dot structure section 12-2 and the charges in the conduction channel (channel structure part 1C-1). Since the charges in the quantum dot structure section 12-1 interact with the charges in the conduction channel (channel structure part 1C-1) through this tunneling, and conduction charges can move in the conduction channel (channel structure part 1C-1), the conduction charges reach the opposite side of the channel structure part 1C-1. Here, the conduction charges also interact with spins in another quantum dot structure section 12-2 via tunneling.

In this way, the interaction of the charges in the quantum dot structure sections 12-1 and 12-2 through the movement of charges in the conduction channel (channel structure part 1C-1), that is, the quantum bits are a specific description for the RKKY interaction. Here, the intensity of interaction is shown in Non-Patent Document 8.

Table 2 shows the parameter dependence.

TABLE 2

| d | $J_d^{RKKY}$ |
|---|---|
| 1 | $\frac{J^2}{4\pi Ry}\frac{m^*}{m_0}\left[\frac{L}{a_0}\right]^2 F_1'(k_F W)$ |
| 2 | $\frac{J^2 n_{e2}}{8\pi^2 Ry}\frac{m^*}{m_0}\left[\frac{S}{a_0}\right]^2 F_2'(k_F W)$ |

$F_1'(x)$ and $F_2'(x)$ are Bessel functions
$F_1'(x) = si(2x) = -\int_{2x}^{\infty} \sin t/t dt$,
$F_2'(x) = J_0(x)N_0(x) + J_1(x)N_1(x)$,
m*: Effective mass of charge
m0: Mass of electron in vacuum
Ry to 13.6 eV: Rydberg Number
a0 to 0.0529 nm: Radius of hydrogen atom
$k_F$: Fermi is number
L: Gate length of transistor
W: Gate width of transistor
S: Area of inversion layer of FINFET $J_d^{RKKY}$ in Table 2 is the intensity of the RKKY interaction in the above Formula (4), d=1 indicates a case where the conduction channel (channel structure part) is in a one-dimensional electron state such as the nanowire shown in FIG. 23, and d=2 indicates a case where the conduction channel is in a two-dimensional electron state as in the normal FINFET structure (the FINFET structure shown in FIG. 1 and the like). As shown in Non-Patent Document 8, it is shown that coherence as a quantum bit is sufficiently maintained.

Figure 6:
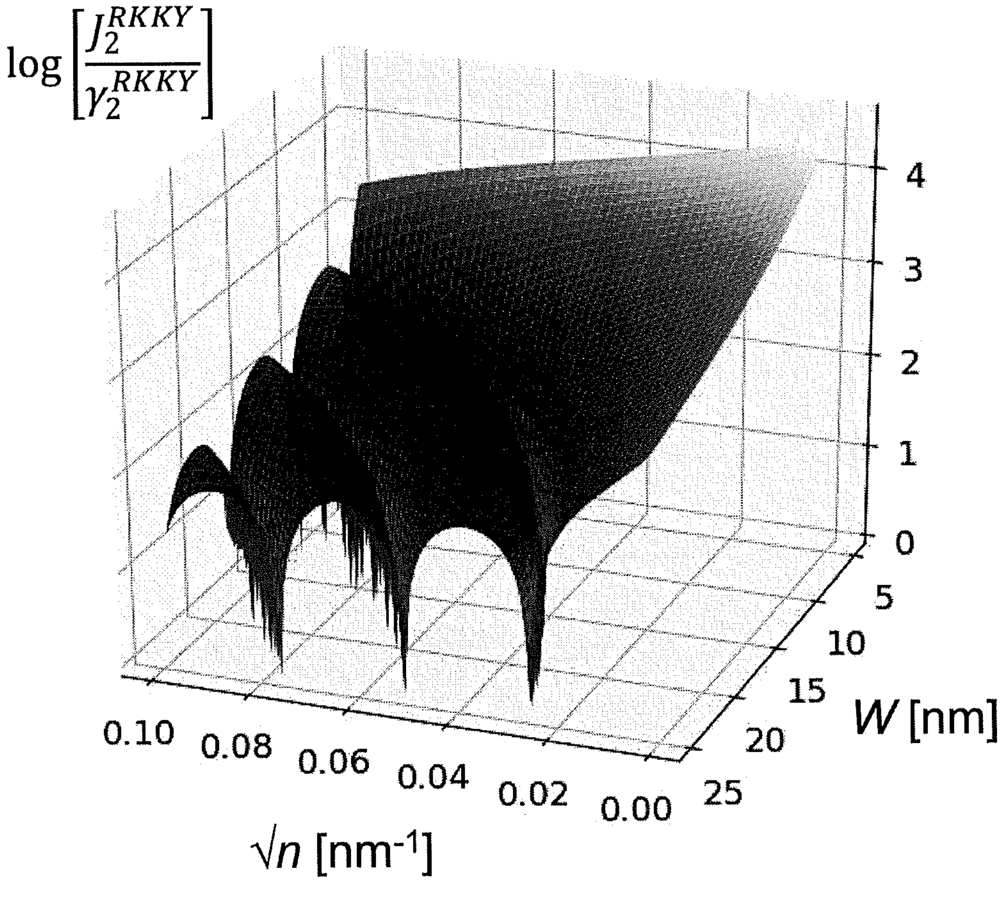
FIG. 6 is a diagram showing an example of a relationship between RKKY interaction and decoherence.

FIG. 6 is a diagram showing an example of a relationship between the RKKY interaction and decoherence. Specifically, FIG. 6 plots one obtained by dividing the intensity of a two-dimensional RKKY interaction by the intensity of the decoherence as a function of a gate width W and electron density n square root. Since the vertical axis is logarithm, it is shown from FIG. 6 that, for example, in case of W=10 nm and the number of electrons is $10^{18}$ electrons/$cm^3$, calculations can be performed 1,000 times or more. Additionally, although the RKKY interaction sometimes competes with the Kondo effect, the RKKY interaction can be utilized by selecting design values.

That is, in the quantum device 1 of the second embodiment, as shown in FIG. 3, the quantum states of the charge spins in the quantum dot structure section 12-1 are changed by utilizing a magnetic field generated by allowing a quantum bit control current to flow through the quantum bit control current line 13 (see FIG. 1 and (B) of FIG. 2). Additionally, the interaction between the charge spins in the quantum dot structure section 12-1 and the charge spins in the quantum dot structure section 12-2 is defined as an indirect interaction via the charges in the channel structure part 1C-1.

Third Embodiment

A third embodiment of the quantum device of the present invention will be described below.

The quantum device 1 of the third embodiment is configured in the same manner as the quantum device 1 of the above-described first embodiment, except for points described below. Therefore, according to the quantum device 1 of the third embodiment, the same effects as those of the quantum device 1 of the above-described first embodiment can be obtained except for the points described below.

Figure 4:
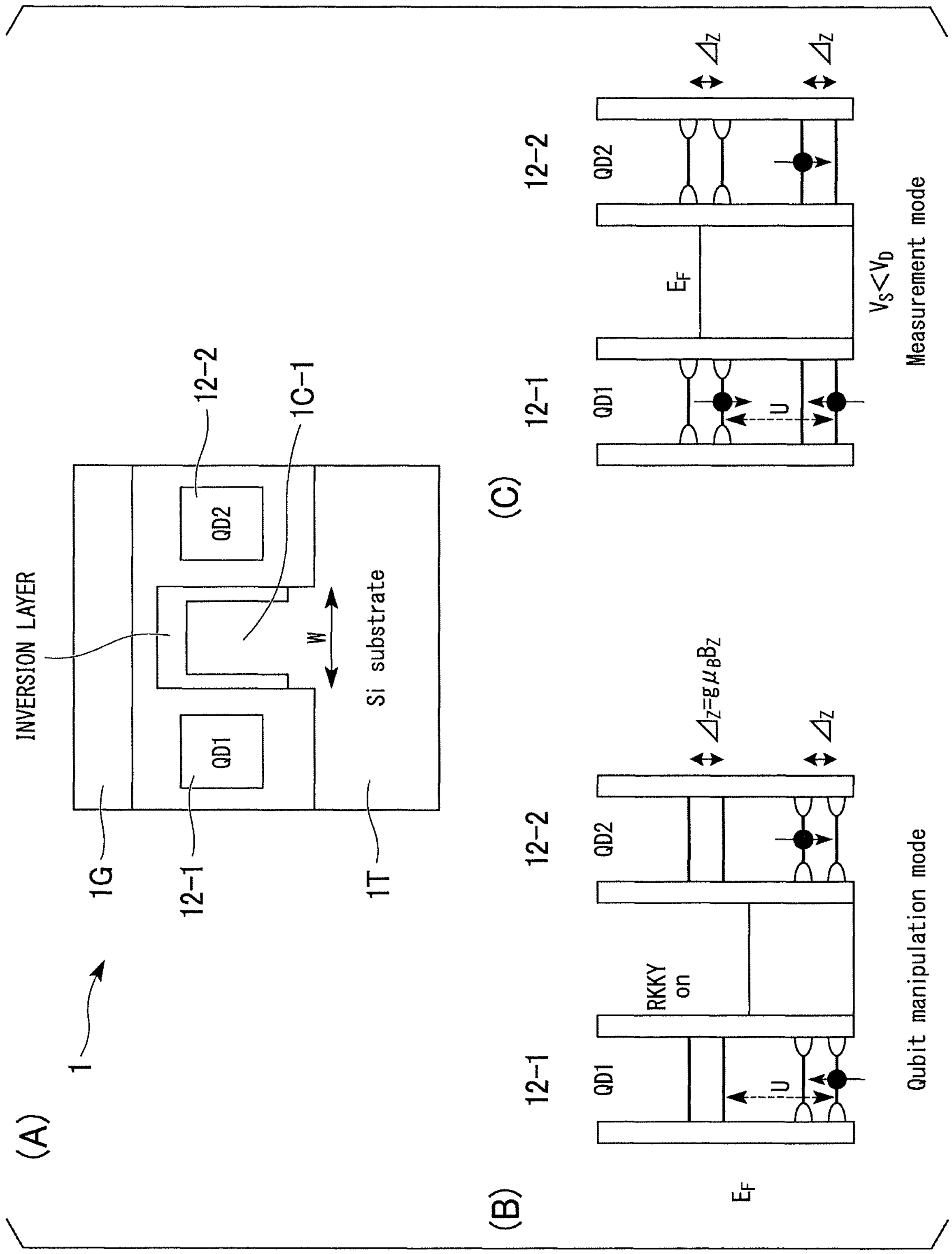
FIG. 4 is a diagram for explaining an example of a quantum device according to a third embodiment.

FIG. 4 is a diagram for explaining an example of the quantum device 1 of the third embodiment. Specifically, (A) of FIG. 4 shows a FIN structure (channel structure part 1C-1) between the two quantum dot structure sections 12-1 and 12-2. (B) and (C) of FIG. 4 show an example of the operation of the quantum device 1 shown in (A) of FIG. 4 using energy bands. Specifically, (B) of FIG. 4 shows a manipulation mode (a state in which the RKKY interaction is ON), and (C) of FIG. 4 shows a measurement mode.

Table 1 shows an example of an operation (mode) corresponding to the manipulation mode of (B) of FIG. 4, the measurement mode of (C) of FIG. 4, and the like.

TABLE 1

TABLE I. Operation in QD-FINFET

| operations | $I_{ctrl}$ | $V_G$ | $V_S$, $V_D$ | Magnetic field |
|---|---|---|---|---|
| memory | 0 | $V_G > 0$ | $V_S = V_D \neq 0$ | $B_Z \neq 0$ |
| qubit manipulation | ≠0 | $V_G > 0$ | $V_S = V_D \neq 0$ | $B_Z \neq 0$ |
| measurement | 0 | $V_G > 0$ | $V_S < V_D$ | $B_Z \neq 0$ |

In the example shown in Table 1, in the manipulation mode of the quantum bits (quantum dot structure sections 12-1 and 12-2), currents $I_{ctrl}$ of the quantum bit control current lines 13-1 and 13-2 (see FIG. 1) are set to a non-zero value, a voltage $V_G$ of the gate 1G (see FIG. 1) is set to a value greater than zero, a voltage $V_S$ of the source 1S (see FIG. 1) is set to a non-zero value, a voltage $V_D$ of the drain 1D (see FIG. 1) is set to a non-zero value, and a transverse magnetic field generated by the quantum bit control current lines 13-1 and 13-2, and the like is set to a non-zero value. Additionally, a magnetic field Bz generated by magnetic field generating means (not shown) other than the quantum bit control current line 13 is set to a non-zero value.

In the measurement mode of the quantum bits (quantum dot structure sections 12-1 and 12-2), the currents $I_{ctrl}$ of the quantum bit control current lines 13-1 and 13-2 is set to zero, the voltage $V_G$ of the gate 1G is set to a value greater than zero, and the voltage $V_S$ of the source 1S is set to a value lower than the voltage $V_D$ of the drain 1D. As a result, a current flows between the source and the drain. Additionally, the states of the charge spins in the quantum dot structure section 12 are estimated on the basis of the current between the source and the drain. In addition, the voltage $V_S$ may be higher than the voltage $V_D$ depending on the symmetry of a circuit. Additionally, the magnetic field Bz generated by magnetic field generating means (not shown) other than the quantum bit control current line 13 is set to a non-zero value.

In the memory mode of the quantum bits (quantum dot structure sections 12-1 and 12-2), the currents $I_{ctrl}$ of the quantum bit control current lines 13-1 and 13-2 is set to zero, the voltage $V_G$ of the gate 1G is set to a value greater than zero, the voltage $V_S$ of the source 1S is set to a non-zero value, and the voltage $V_D$ of the drain 1D is set to a non-zero value. Additionally, the magnetic field Bz generated by magnetic field generating means (not shown) other than the quantum bit control current line 13 is set to a non-zero value.

As shown in FIG. 4, the electron spins have different energy levels in an upward direction and a downward direction in a state in which the static magnetic field is applied. In the example shown in FIG. 4, it is assumed that the gate length is 30 nm or less and the size of the quantum dots (quantum dot structure sections 12-1 and 12-2) is 20 nm or less. In the quantum dots micronized in this way, when extra electrons try to enter the quantum dot, the Coulomb force between the charges are non-negligible. In (B) and (C) of FIG. 4, "U" indicates the magnitude of the Coulomb energy. The second electron in the quantum dot has an energy level U higher than the energy level of the quantum bit.

In the example shown in FIG. 4, as shown in Table 1, the operation modes of the quantum device 1 are typically a manipulation mode of the quantum bits (quantum dot structure sections 12-1 and 12-2), a mode (measurement mode) in which the quantum states of the quantum bits are measured, and a mode (memory mode) in which nothing is performed on the quantum bits. Differences between the modes are distinguished by the positions of energy levels within the quantum dot used.

First, in a case where the state of a quantum bit is controlled, it is assumed that the Fermi surface of a channel is near the energy level of an underlying quantum bit. In this way, the above-described RKKY interaction via electrons in a channel inversion layer can be utilized (the manipulation mode shown in (B) of FIG. 4).

In the measurement mode shown in (C) of FIG. 4, the gate voltage is further applied to increase the amount of charges in the channel, thereby elevating the position of the Fermi surface and utilizing upper potentials in the quantum dot. Since upper two levels in the quantum dot appear differently depending on the spin states, the spin states of the quantum bit can be measured.

In FIG. 4 and the like, Δz indicates a difference in Zeeman energy resulting from the magnetic field. A portion between the quantum dot structure sections 12-1 and 12-2 in(B) and (C) of FIG. 4 shows the FIN structure (channel structure part 1C-1). In (B) of FIG. 4, QD1 (quantum dot structure section 12-1) is in an upward spin state, and QD2 (quantum dot structure section 12-2) is in an upward spin state.

In the example shown in (B) of FIG. 4, the current of a control electrode (quantum bit control current line 13-1) for QD1 (quantum dot structure section 12-1) and the current of a control electrode (quantum bit control current line 13-2) for QD2 (quantum dot structure section 12-2) are in opposite directions to each other.

In the example shown in (B) of FIG. 4, not only $V_S=V_D$ is controlled in a FIN portion between QD1 and QD2, but also $V_S=V_D$ is controlled in a left FIN portion of QD1 (not shown in (B) of FIG. 4) and $V_S=V_D$ is controlled in a right FIN portion of QD2 (not shown in (B) of FIG. 4).

In the example shown in (C) of FIG. 4, $V_S<V_D$ is controlled in the FIN portion between QD1 and QD2.

In the example shown in FIG. 4, Fermi levels are different between the measurement mode and an interaction mode. Additionally, during measurement, a quantum level different from the energy level of the quantum bit is utilized.

Figure 5:
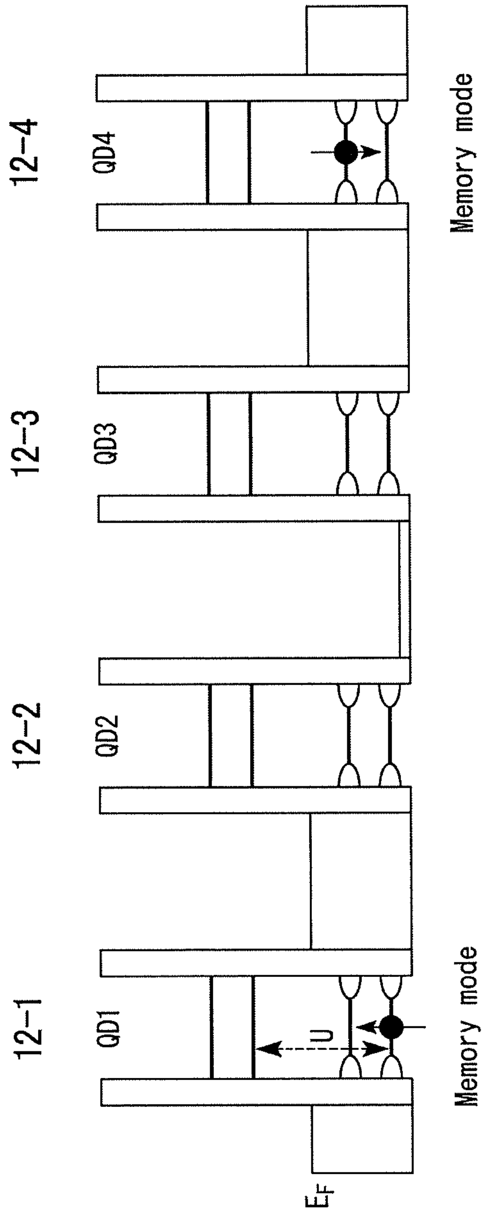
FIG. 5 is a diagram for explaining an example of a memory mode of a quantum bit.

FIG. 5 is a diagram for explaining an example of the memory mode of the quantum bit.

Quantum bits are formed on both sides of the channel (channel structure part 1C (see FIG. 1)) to which a gate voltage $V_G$ is applied, and the quantum bits on both sides always interact with each other. FIG. 5 shows an example in a case where it is desired to hold a quantum bit alone.

In the example shown in FIG. 5, the quantum bits held are QD1 and QD4. In order to hold the quantum bits independently, it is necessary to place quantum dots such as QD2 and QD3 between the quantum bits.

The RKKY interaction between the quantum bits through the channel simultaneously degrades the coherence. On the basis of the formula of Non-Patent Document 8, a relationship obtained by dividing the magnitude of the RKKY interaction by the magnitude of a decoherence ratio is calculated, which is shown in the above-described FIG. 6. As described above, in FIG. 6, W indicates the gate width and n is the number of electrons in the inversion layer. This ratio indicates the number of times by which calculations can be performed while one-time coherence is maintained.

A magnetic field control line is used to change the direction of the quantum bit. For example, assuming that the distance from the quantum bit to the magnetic field control line is 20 nm, in order to generate a magnetic field of 1 mT (Tesla) at the position of the quantum bit, the current I shown in Formula (6) has only to be allowed to flow. In Formula (6), $\mu_B=1.256563*10^{-6}$ mkgs$^{-2}$A$^{-2}$ is the magnetic permeability of silicon.

$$I = 2\pi rB/\mu_B - 10\ \mu\text{A} \tag{6}$$

Fourth Embodiment

A fourth embodiment of the quantum device of the present invention will be described below.

The quantum device 1 of the fourth embodiment is configured in the same manner as the quantum device 1 of the above-described first embodiment, except for points described below. Therefore, according to the quantum device 1 of the fourth embodiment, the same effects as those of the quantum device 1 of the above-described first embodiment can be obtained except for the points described below.

Operation of Quantum Annealing Machine

The operation of the quantum annealing machine is as follows. First, in the case of the quantum annealing machine, the quantum annealing machine is utilized in a stronger magnetic field (for example, 10 T (Tesla)) than being used as a quantum computer. In this case, the RKKY interaction has components in the three directions of x, y, and z as shown in Formula (3). It is possible to solve a combinatorial optimization problem by performing conversion as shown in Non-Patent Document 7 to performing mapping to the Ising Hamiltonian as in Formula (3). Here, $J_{ij}$ needs to change its value in conformity with each problem. The magnitude of $J_{ij}$ can be controlled with the Fermi energy of each channel as shown in Table 2. Since each channel can be controlled independently, even when the gate electrode is common, when the potential of the source and drain is lowered, the position of the Fermi energy of electrons can be changed accordingly. That is, as shown in Table 2, a Fermi wavenumber $k_F$ is included in the Bessel function due to a change in the position of the Fermi energy, which is connected to a Fermi energy $E_F$ in a relationship shown in Formula (5).

$$E_F = \frac{h^2 k_F^2}{2m^*} \tag{5}$$

The transverse magnetic field in Formula (2) is controlled with a magnetic field generated by applying a current to a control current line (quantum bit control current line 13). That is, quantum tunneling is performed while the current is flowing, and in a case where the current is zero, the Hamiltonian of Formula (3) is obtained. Thus, an answer can be obtained.

Fifth Embodiment

A fifth embodiment of the quantum device of the present invention will be described below.

The quantum device 1 of the fifth embodiment is configured in the same manner as the quantum device 1 of the above-described first embodiment, except for points described below. Therefore, according to the quantum device 1 of the fifth embodiment, the same effects as those of the quantum device 1 of the above-described first embodiment can be obtained except for the points described below.

Measurement Process 1

Finally, it is necessary to read whether the electron spins are upward or downward. In the present invention, this is read out with a normal channel current of the FINFET structure. In the present invention, a quantum dot (quantum dot structure section 12) is connected to a channel (channel structure part 1C) via the quantum tunneling. Since the charges entering from the source 1S of the channel (channel structure part 1C) are electrically coupled to the level in the quantum dot (quantum dot structure section 12), the charges are affected by the energy level in the quantum dot (quantum dot structure section 12). Since the energy level in the quantum dot (quantum dot structure section 12) varies depending on the directions of the spins due to the magnetic field, the directions of the spins in the quantum dot (quantum dot structure section 12) can be measured by the current (current between the source and the drain) of the channel (channel structure part 1C). This is referred to as a spin filter effect herein.

Figure 7:
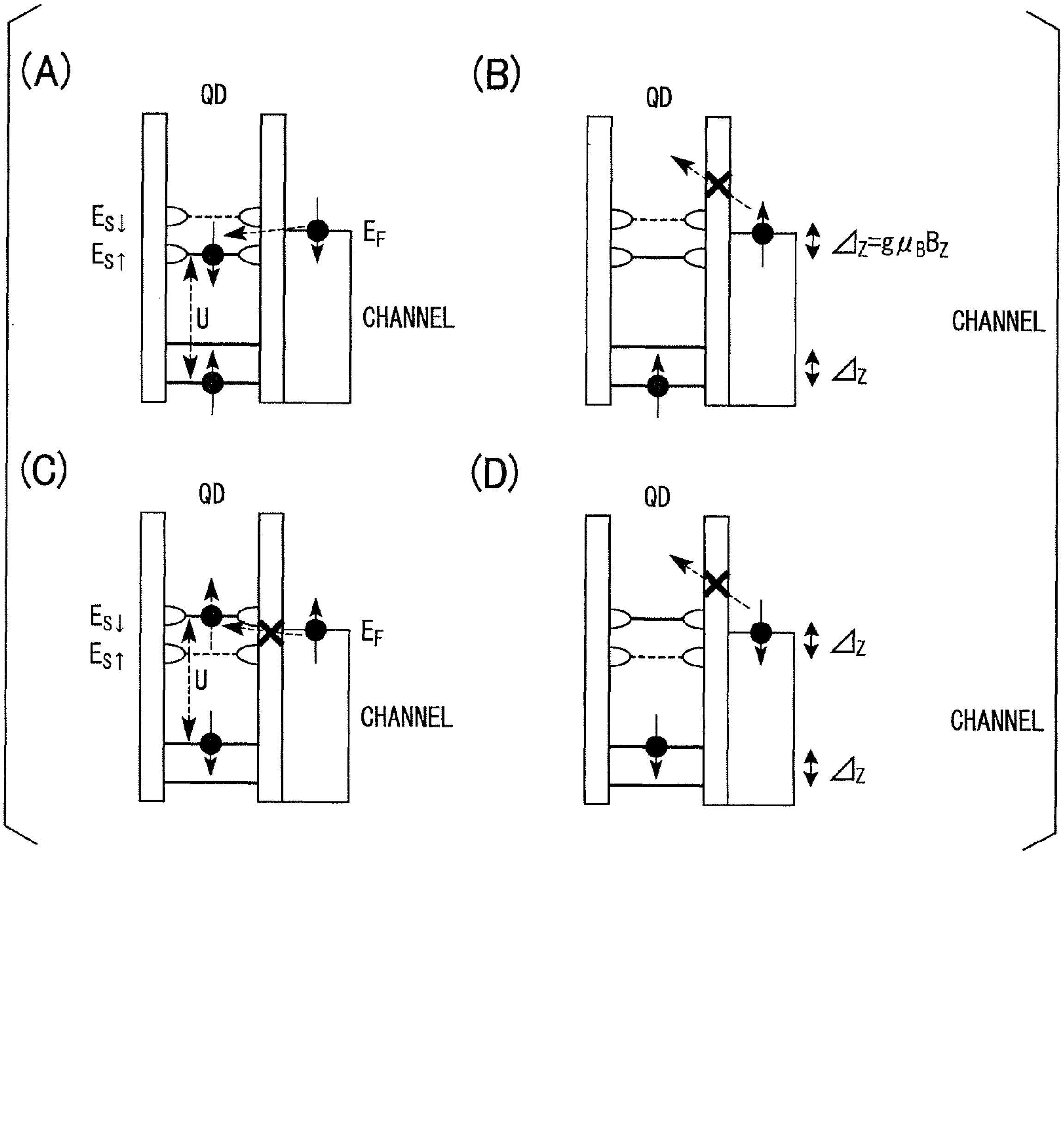
FIG. 7 is a diagram showing the principle of a spin filter effect.

FIG. 7 is a diagram showing the principle of the spin filter effect.

In (A), (B), (C), and (D) of FIG. 7, each left side shows a quantum dot QD (quantum dot structure sections 12), and each right side shows a channel (channel structure part 1C). In this case, an energy level higher than the energy level of spins representing a quantum bit by the Coulomb energy is utilized. This can mitigate a direct change in a quantum bit state resulting from a measurement. In order to change a current flowing through each channel depending on spin states of the quantum bit, as shown in FIG. 7, the Fermi level $E_F$ of the channel is preferably between more separated charge levels of a magnetic field in a quantum dot (quantum dot structure section 12).

(A) and (B) of FIG. 7 show a state when the spin quantum bit is in the upward state |↑>. The charges in the channel (channel structure part 1C) have an upward spin and a downward spin, and (A) of FIG. 7 shows a case where the charges in the channel are upward. In this case, since an energy level $E_{S\downarrow}$ which is higher than the charges in the quantum dot (quantum dot structure section 12) by U is lower than the Fermi level $E_F$ of the channel, a charge with the downward spin in the channel is easy to enter the quantum dot. On the other hand, in order for the upward spin to enter the quantum dot as shown in (B) of FIG. 7, the upward spin should enter the upper level of the quantum dot. However, since this level is higher than the Fermi level of the channel, it is difficult for this charge to enter the quantum dot.

(B) and (C) of FIG. 7 show a case where the state of the quantum bit in each quantum dot is the downward state |↓>. In this case, since the levels of the quantum dot are higher than the Fermi level of the channel, the charges in the channel are less likely to enter regardless of whether the spins are upward or downward as shown in these figures. From (A) to (D) of the above FIG. 7, the current (the current between the source and the drain) changes depending on whether the state of the quantum bit is upward |↑> or downward |↓>.

Figure 8:
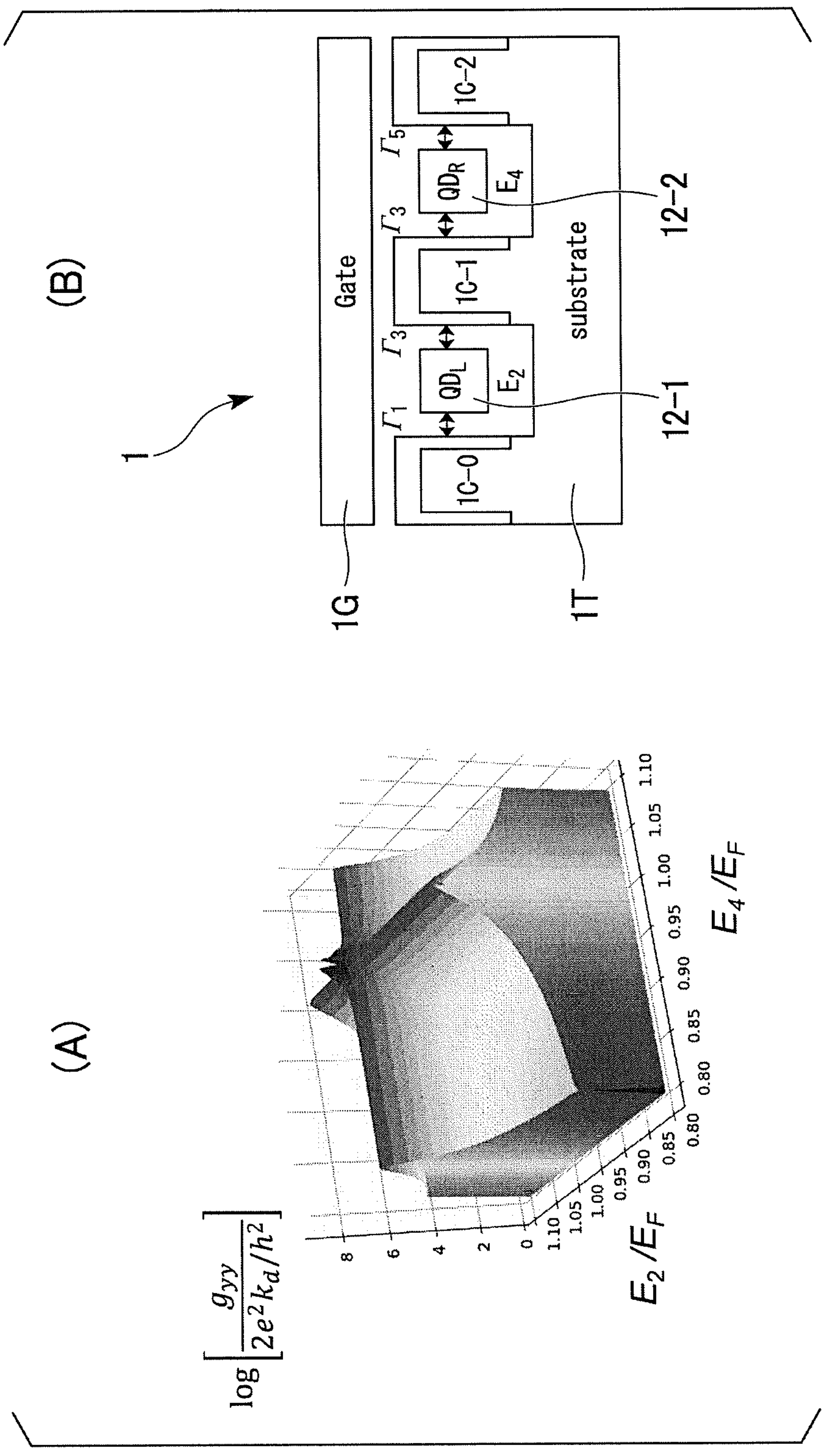

FIG. 8 is a diagram obtained by deriving and simulating the electrical conductivity from the Kubo formula, which is a theory of linear response, in this situation. Specifically, (A) of FIG. Bis a diagram showing the simulation results. A general tunneling Hamiltonian is used as a model and is described as in Formula (7) (y indicates a channel direction). In Formula (7), E2 and E4 represent energy levels of the quantum dots, and $E_{ki}$=1, 3, 5) represents three channels.

$$H_0 = E_2 d_{2s}^\dagger d_{2s} + E_4 d_{4s}^\dagger d_{4s} + \sum_{i=1,3,5}\sum_{k_i,s} E_{k_i} c_{k_i s}^\dagger c_{k_i s} + \sum_{\alpha=L,R}\sum_{k_\alpha,s} E_{k_\alpha,s} c_{k_\alpha,s}^\dagger c_{k_\alpha,s} + \sum_{k1}\left[V_{k_1} c_{k_1 s}^\dagger d_{2s} + V_{k_1}^* d_{2s}^\dagger c_{k_1 s}\right] + \sum_{k3}\left[V_{k_3} c_{k_3 s}^\dagger (d_{2s} + d_{4s}) + V_{k_3}^* \left(d_{2s}^\dagger + d_{4s}^\dagger\right) c_{k_3 s}\right] + \sum_{k5}\left[V_{k_5} c_{k_5 s}^\dagger d_{4s} + V_{k_5}^* d_{4s}^\dagger c_{k_5 s}\right] \quad (7)$$

A formula of electrical conduction derived from the Kubo formula is expressed as Formula (8).

$$g_{yy} = \frac{2e^2}{h} k_d \left\{ \frac{|V_{k_1}|^4 (e_4^2 + s_{31}^2)^2}{\left[(e_1 e_4 - s_{31}^2)^2 + e_4^2 \Gamma_1^2\right]^2} + \frac{|V_{k_5}|^4 (e_3^2 + s_{35}^2)^2}{\left[(e_3 e_6 - s_{35}^2)^2 + e_3^2 \Gamma_5^2\right]^2} + \frac{|V_{k_F}|^4 \left[(e_3 + s_{33})^2 + (e_5 + s_{33})^2\right]^2}{\left[(e_2 e_5 - s_{33}^2)^2 + \Gamma_3^2 (e_2 + e_5 + 2s_{33})^2\right]^2} + \frac{2|V_{k_1}|^2 |V_{k_3}|^2 (e_4(e_2 + s_{33}) + s31(e_5 + s_{33}))^2}{\left[(e_1 e_4 - s_{31}^2)^2 + e_4^2 \Gamma_1^2 (e_2 e_5 - s_{33}^2)^2 + \Gamma_3^2 (e_2 + e_5 + 2s_{33})^2\right]} + \frac{2|V_{k_1}|^2 |V_{k_5}|^2 [s_{35} e_4 + s_{31} e_3]^2}{\left[(e_1 e_4 - s_{31}^2)^2 + e_4^2 \Gamma_1^2 (e_6 e_3 - s_{35}^2)^2 + e_3^2 \Gamma_5^2\right]} + \frac{2|V_{k_3}|^2 |V_{k_5}|^2 [s_{35}(e_2 + s_{33}) + e_3(e_5 + s_{33})]^2}{\left[(e_2 e_5 - s_{33}^2)^2 + \Gamma_3^2 (e_2 + e_5 + 2s_{33})^2\right]\left[(e_6 e_3 - s_{35}^2)^2 + e_3^2 \Gamma_5^2\right]} \right\} \quad (8)$$

In Formula 8, $k_1$=1 and $k_2$=πn$W^2$ each indicate cases where channel conduction is one-dimensional and two-dimensional (n is the number of electrons). e1, e3, and e5 indicate effective electron energies in the channel, $s_{ij}$ indicates self-energy, and Γi indicates the intensity of tunneling between the quantum dot and the channel. As can be seen from (A) of FIG. 8, a conductance $\sigma_{yy}$ increases as a difference between E2 and E4 increases. This is because in a case where the FINFET is used as a measurement device, two quantum dots (quantum dot structure sections 12-1 and 12-2) serve as floating gates and have a shape similar to that of a differential amplifier circuit of the two floating gates. The above is the case of three conduction channels, but the same principle holds even when there are a large number of conduction channels.

That is, the quantum device 1 of the fifth embodiment utilizes the fact that the charge spins in the quantum dot structure section 12 have different energy levels depending on the states of the charges in the quantum dot structure section 12. The states of the charge spins in the quantum dot structure section 12 sandwiched between, for example, the channel structure part 1C-1 and the channel structure part 1C-2 included in the plurality of channel structure parts 1C are estimated on the basis of, for example, measured values of the current between the source and the drain flowing through the channel structure part 1C-1.

Sixth Embodiment

A sixth embodiment of the quantum device of the present invention will be described below.

The quantum device 1 of the sixth embodiment is configured in the same manner as the quantum device 1 of the above-described first embodiment, except for points described below. Therefore, according to the quantum device 1 of the sixth embodiment, the same effects as those of the quantum device 1 of the above-described first embodiment can be obtained except for the points described below.

Measurement Process 2

Figure 9:
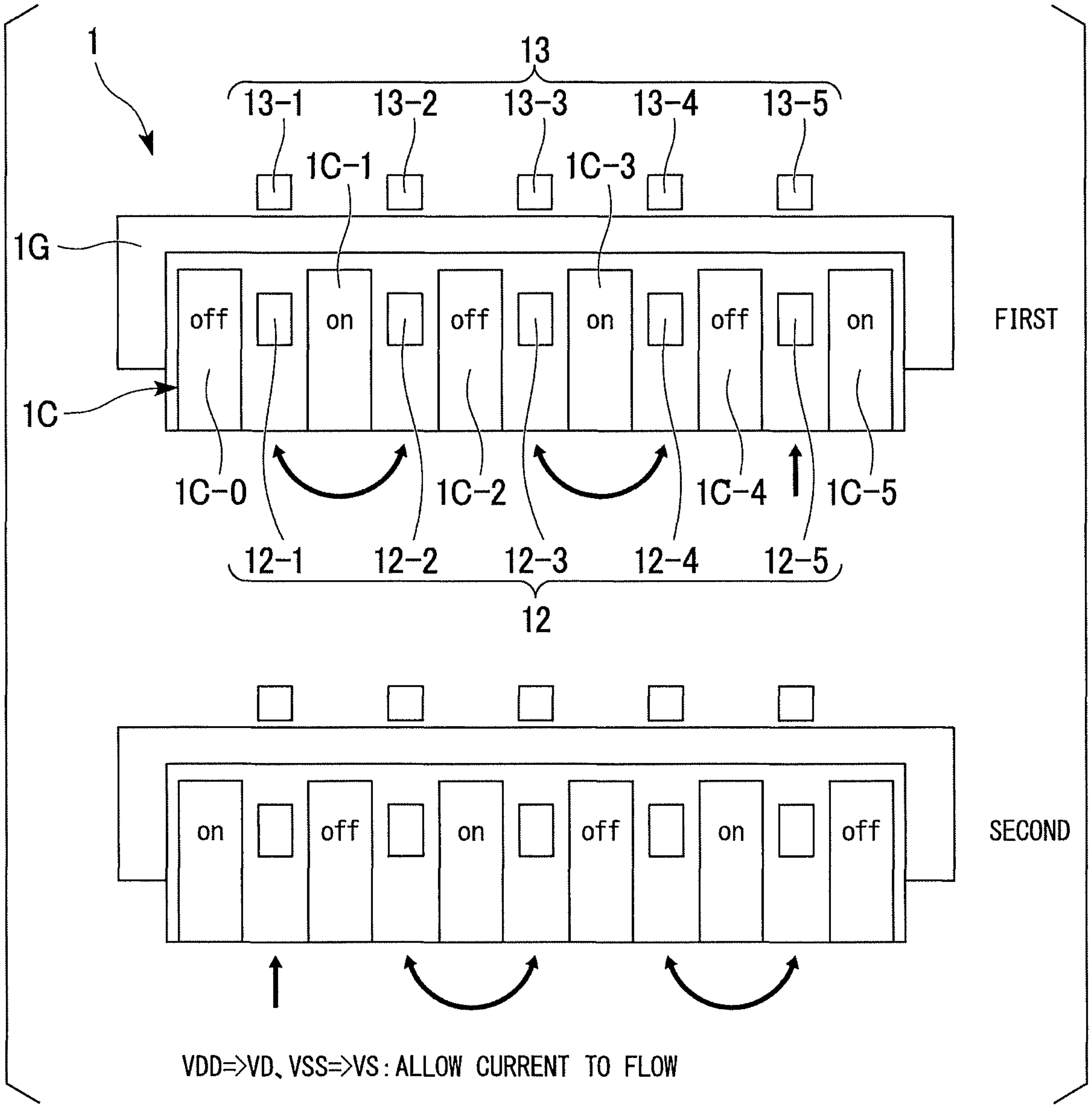
FIG. 9 shows an example of a measurement method in a case where there are a large number of conduction channels.

FIG. 9 shows an example of a measurement method in a case where there are a large number of conduction channels. A potential difference has only to be given between the source and the drain in order to allow a current to flow through a conduction channel (channel structure part 1C) (Table 1). In a case where there are a large number of conduction channels (channel structure parts 1C-0, 1C-1, 1C-2, . . . ), the conduction channels may be measured one by one and an energy difference between adjacent quantum dots (quantum dot structure sections 12) may be measured as shown in FIG. 8. However, as shown in FIG. 9, the efficiency of the measurement can be improved by simultaneously measuring the conduction channels separated by one (VS<VD). Of course, every three conduction channels may be measured, or every three or more conduction channels may be measured at the same time. Additionally, conduction channels may be continuously measured one after another, at intervals such as several nanoseconds before the measurement of one conduction channel is completed.

In a case where it is desired to measure only two specific quantum bits, it is possible to realize various measurement methods such as comparing a current in a case where the conduction channel between the quantum bits is turned on with a current in a case where either outer conduction channel is turned on.

Seventh Embodiment

A seventh embodiment of the quantum device of the present invention will be described below.

The quantum device 1 of the seventh embodiment is configured in the same manner as the quantum device 1 of the above-described first embodiment, except for points described below. Therefore, according to the quantum device 1 of the seventh embodiment, the same effects as those of the quantum device 1 of the above-described first embodiment can be obtained except for the points described below.

Crosstalk

Since a distance between quantum bits (for example, a distance between the quantum dot structure sections 12-1 and 12-2) is short, the problem is that there is a possibility that the crosstalk between the quantum bits occurs. In order to prevent this, as shown in Non-Patent Document 6, there is a technique of making the directions of currents flowing in adjacent current lines opposite to each other. In a case where there are N+1 magnetic field control lines (quantum bit control current lines 13-1, 13-2, . . . ) and a current Ii (0≤i≤N) flows in each magnetic field control line, a magnetic field represented by Formula (9) can be generated in a quantum bit having a distance r from the substrate (substrate portion 1T). In Formula (9), $p=r/(r^2+W^2)^{1/2}$.

$$h_0 = \frac{1}{2\pi r}[I_0 - pI_1],\ h_N = (-)^N\frac{1}{2\pi r}[I_N - pI_{N-1}], \tag{9}$$

$$h_i = -\frac{1}{2\pi r}[I_i - p(I_{i-1} + I_{i+1})],\ \text{for } 0 < i < N$$

In a case where it is desired to generate only a magnetic field for the n-th quantum bit, it is necessary for the magnetic field to satisfy a relationship shown in Formula (10), and this condition can be realized under a current condition shown in Formula (11).

$$h_0 = h_1 = \ldots = h_{n-1} = h_{n+1} = \ldots\ h_N = 0 \tag{10}$$

$$I_0 = pI_1,\ I_N = pI_{N-1},$$

$$I_i = p(I_{i-1} + I_{i+1}),\ (i \neq n)$$

$$h_n = \frac{1}{2\pi r}[I_n - p(I_{n-1} + I_{n+1})], \tag{11}$$

Figure 10:
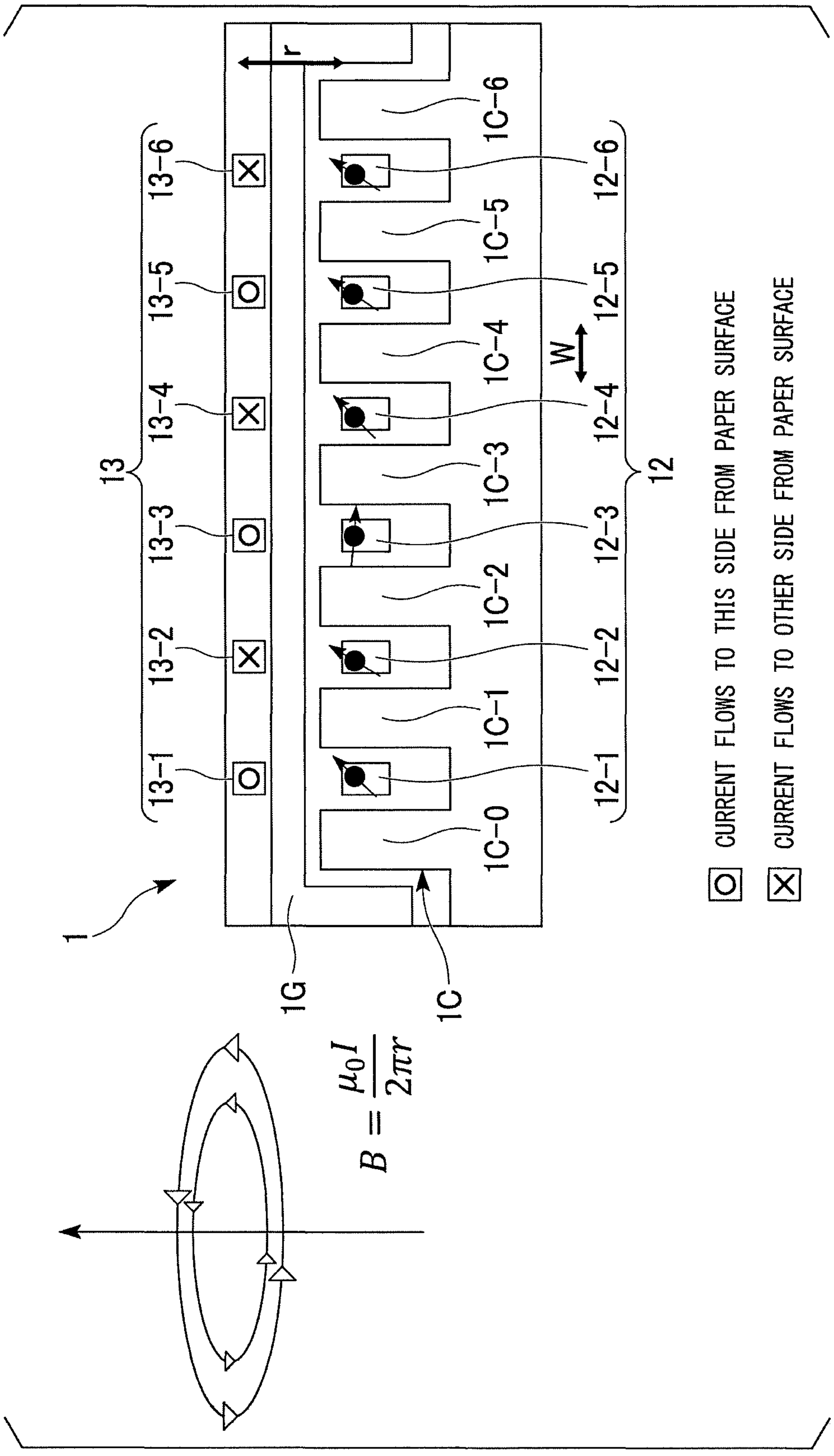
FIG. 10 is a diagram showing an example in a case where six quantum bits (N=5) are controlled.

FIG. 10 is a diagram showing an example in a case where six quantum bits (N=5) (quantum dot structure sections 12-1 to 12-6) are controlled.

In the example shown in FIG. 10, in order to generate a magnetic field only in a fourth quantum bit, a current shown in Formula (12) has only to be allowed to flow.

$$I_2 = \frac{p(1+p^2)}{1+2p^2}I_3,\ I_4 = \frac{p}{1+p^2}I_3, \tag{12}$$

$$I_1 = \frac{p}{1-p^2}I_2,\ I_5 = pI_4,\ I_0 = pI_1.$$

In this case, the magnitude of a magnetic field received by the fourth quantum bit is the magnitude shown in Formula (13). In general, it is necessary to satisfy $np^2 \neq 1$ (n=1, 2, . . . ) and $L \neq r(n-1)^{1/2}$.

$$h_3 = \left[1 - \frac{p^2(1-p^2)}{1-2p^2} - \frac{p^2}{1+p^2}\right]I_3, \tag{13}$$

Eighth Embodiment

An eighth embodiment of the quantum device of the present invention will be described below.

The quantum device 1 of the eighth embodiment is configured in the same manner as the quantum device 1 of the above-described first embodiment, except for points described below. Therefore, according to the quantum device 1 of the eighth embodiment, the same effects as those of the quantum device 1 of the above-described first embodiment can be obtained except for the points described below.

Figure 11:
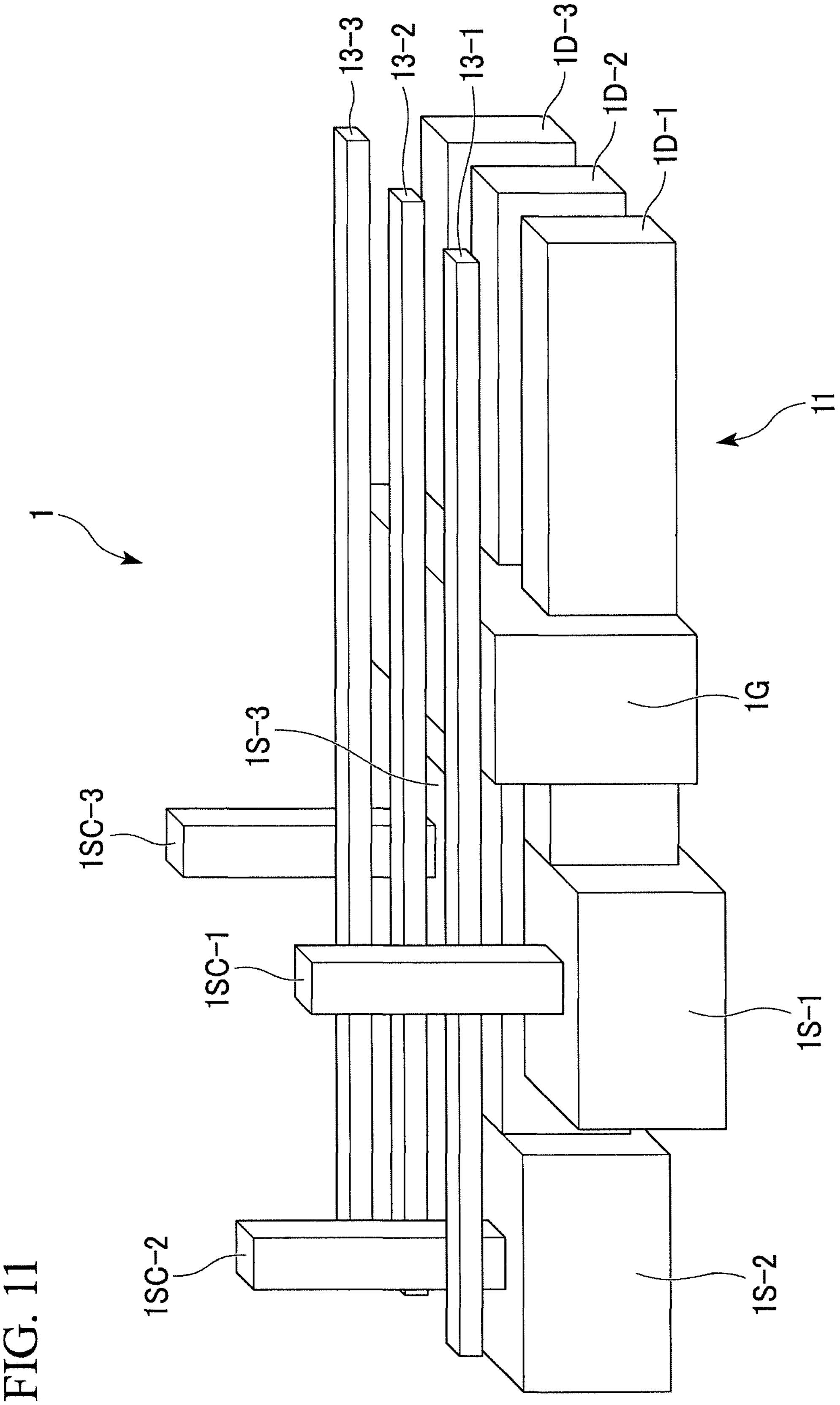
FIG. 11 is a diagram showing a first example of a quantum device of an eighth embodiment.

FIG. 11 is a diagram showing a first example of the quantum device 1 of the eighth embodiment.

In the example shown in FIG. 11, the quantum bit control lines (quantum bit control current lines 13-1, 13-2, and 13-3) are additional structures to be added to the normal FINFET structure. Therefore, it is necessary to perform installation avoiding related-art structures such as source and drain vias.

In the example shown in FIG. 11, the quantum device 1 includes the transistor structure section 11 (for example a FINFET structure configured similarly to a normal FINFET structure), a quantum dot structure section (not shown in FIG. 11) in which charges are localizable, and quantum bit control current line 13-1, 13-2, and 13-3.

The transistor structure section 11 has a substrate portion (not shown in FIG. 11) and a FIN-shaped portion. Additionally, the transistor structure section 11 has sources 1S-1, 1S-2, and 1S-3, source electrodes 1SC-1, 1SC-2, and 1SC-3, drains 1D-1, 1D-2, and 1D-3, and the gate 1G. The transistor structure section 11 has a channel structure part between the source 1S-1 and the drain 1D-1, a channel structure part between the source 1S-2 and the drain 1D-2, and a channel structure part between the source 1S-3 and the drain 1D-3.

In the example shown in FIG. 11, the quantum device 1 includes three channel structure parts. Additionally, a quantum dot structure section corresponding to the quantum bit control current line 13-1, a quantum dot structure section corresponding to the quantum bit control current line 13-2, and a quantum dot structure section corresponding to the quantum bit control current line 13-3 are included in the quantum device 1.

In the example shown in FIG. 11, the quantum dot structure section corresponding to the quantum bit control current line 13-1 is sandwiched by the channel structure part between the source 1S-1 and the drain 1D-1 and the channel structure part between the source 1S-2 and the drain 1D-2.

The quantum dot structure section corresponding to the quantum bit control current line 13-2 is sandwiched by the channel structure part between the source 1S-2 and the drain 1D-2 and the channel structure part between the source 1S-3 and the drain 1D-3.

In the example shown in FIG. 11, a current flowing between the source 1S-1 and the drain 1D-1, a current flowing between the source 1S-2 and the drain 1D-2, and a current flowing between the source 1S-3 and the drain 1D-3 can be made different from each other.

Figure 12:
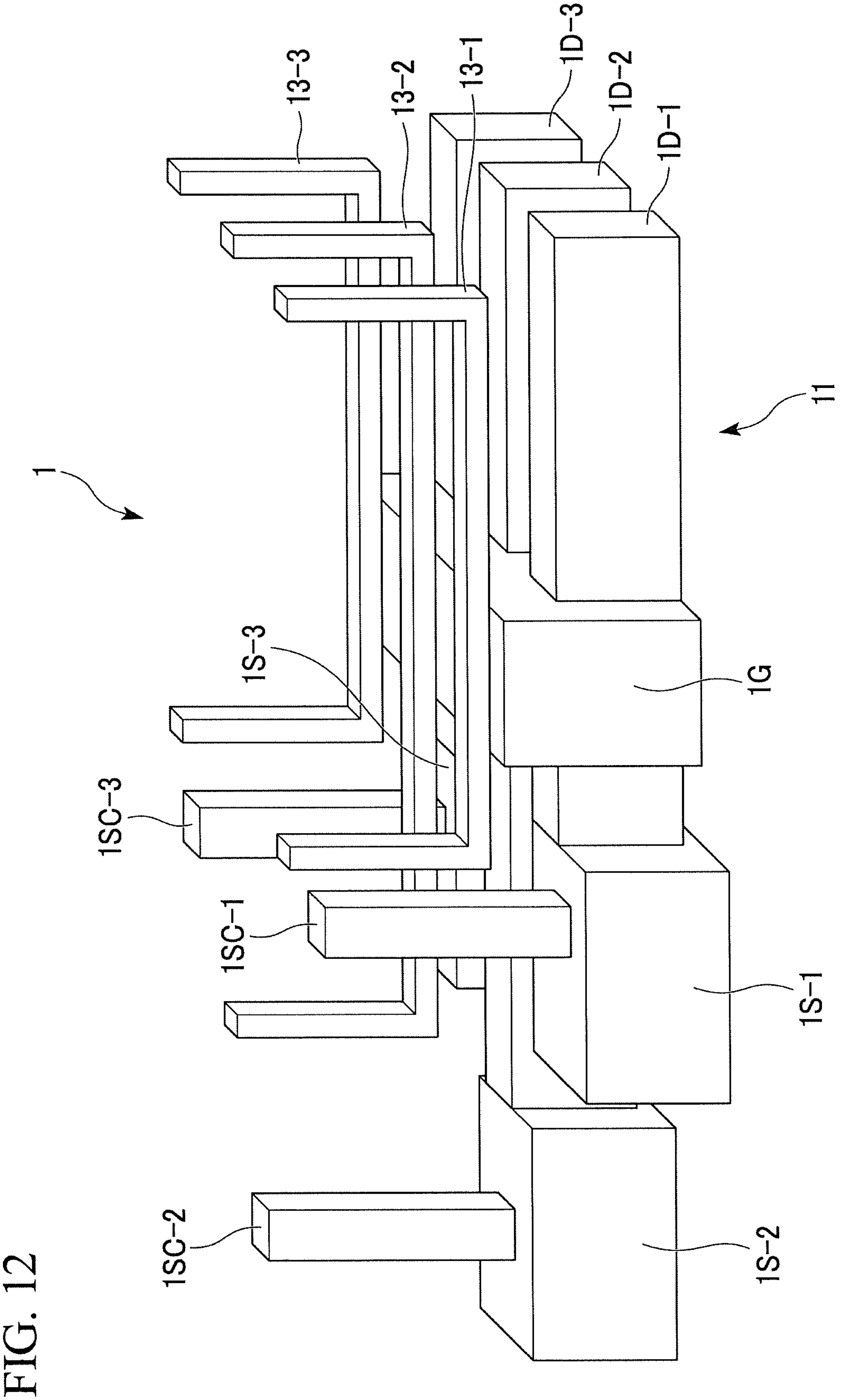
FIG. 12 is a diagram showing a second example of the quantum device of the eighth embodiment.

FIG. 12 is a diagram showing a second example of the quantum device 1 of the eighth embodiment.

In the example shown in FIG. 12, similarly to the example shown in FIG. 11, the quantum bit control lines (quantum bit control current lines 13-1, 13-2, and 13-3) are additional structures to be added to the normal FINFET structure. Therefore, it is necessary to perform installation avoiding related-art structures such as source and drain vias.

In the example shown in FIG. 12, since the quantum bit control current lines 13-1, 13-2, and 13-3 are bent, any interference or the like with the source electrodes 1SC-1, 1SC-2, and 1SC-3 can be avoided.

In the example shown in FIG. 12, similarly to the example shown in FIG. 11, the quantum device 1 includes the transistor structure section 11 (for example a FINFET structure configured similarly to the normal FINFET structure), a quantum dot structure section (not shown in FIG. 12) in which charges are localizable, and the quantum bit control current lines 13-1, 13-2, and 13-3.

The transistor structure section 11 is configured similarly to the transistor structure section 11 shown in FIG. 11.

In the example shown in FIG. 12, the quantum dot structure section corresponding to the quantum bit control current line 13-1 and the quantum dot structure section corresponding to the quantum bit control current line 13-2 are configured similarly to the example shown in FIG. 11.

In the example shown in FIG. 12, similarly to the example shown in FIG. 11, the current flowing between the source 1S-1 and the drain 1D-1, the current flowing between the source 1S-2 and the drain 1D-2, and the current flowing between the source 1S-3 and the drain 1D-3 can be made different from each other.

Ninth Embodiment

A ninth embodiment of the quantum device of the present invention will be described below.

The quantum device 1 of the ninth embodiment is configured in the same manner as the quantum device 1 of the above-described first embodiment, except for points described below. Therefore, according to the quantum device 1 of the ninth embodiment, the same effects as those of the quantum device 1 of the above-described first embodiment can be obtained except for the points described below.

Figure 13:
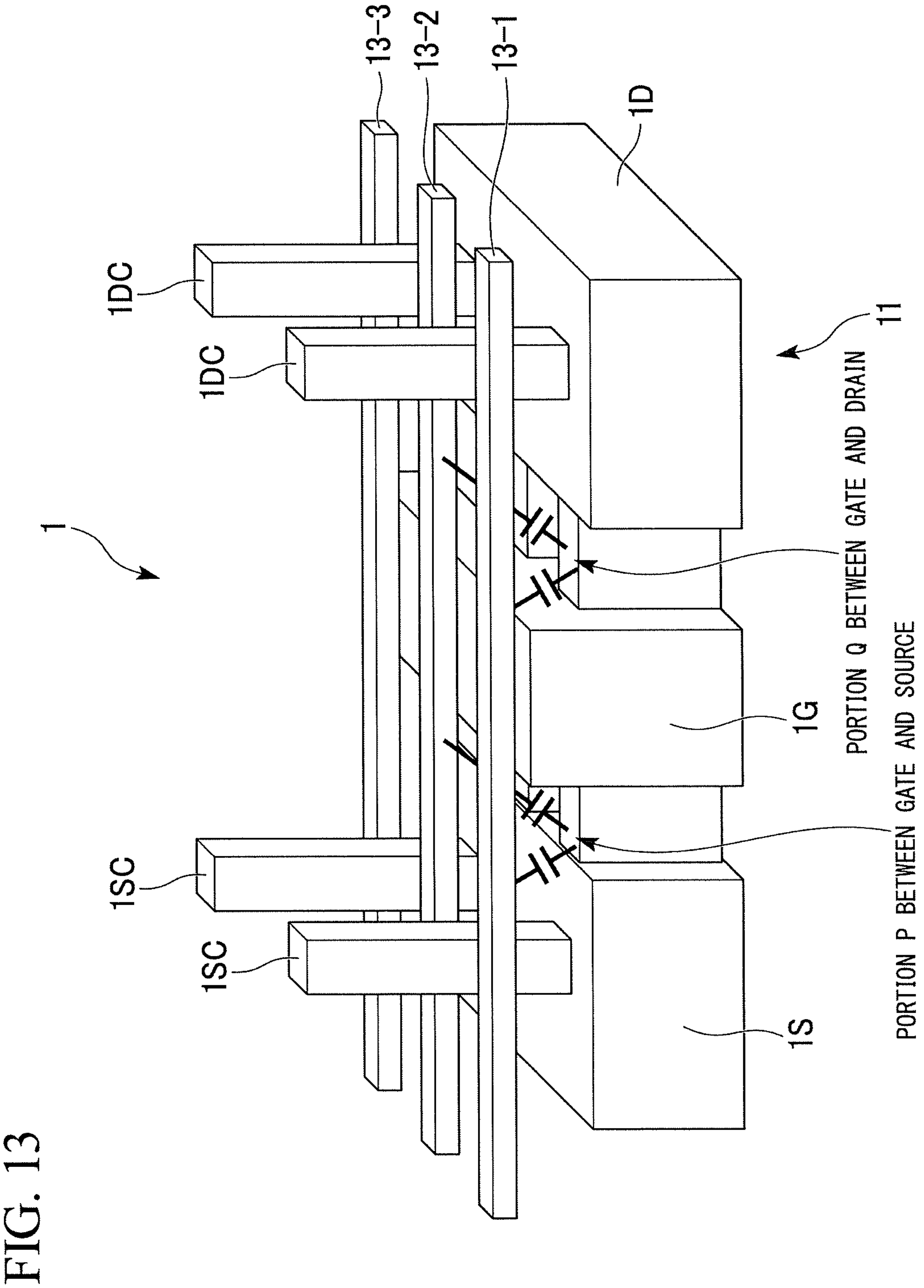
FIG. 13 is a diagram showing a first example of a quantum device of a ninth embodiment.

FIG. 13 is a diagram showing a first example of the quantum device 1 of the ninth embodiment.

A portion P (space) and a portion Q (space) shown in FIG. 13 are present between the source and drain of a via a connection portion to an upper electrode and a gate electrode (gate 1G). A parasitic capacitance is electrically present between these portions and electrodes (quantum bit control current lines 13-1 and 13-2) that control a magnetic field. Therefore, when the potential of the electrodes (quantum bit control current lines 13-1 and 13-2) that control the magnetic field is increased or decreased, the potential of a channel (the channel structure part 1C between the source and the drain) is also increased or decreased accordingly. Since a current flows through the channel (channel structure part 1C) by decreasing the potential of the drain 1D, the current will not flow when the potential of the portion Q is increased. In this way, the channel current can be turned ON/OFF depending on the potential of the electrodes (quantum bit control current lines 13-1 and 13-2) that control the magnetic field. Therefore, in the example shown in FIG. 13, unlike the examples shown in FIGS. 11 and 12, the source 1S and the drain 1D are shared. Accordingly, the production cost of the quantum device 1 can be significantly reduced.

In the example shown in FIG. 13, the source electrode 1SC is connected to the source 1S, and the drain electrode 1DC is connected to the drain 1D.

Figure 14:
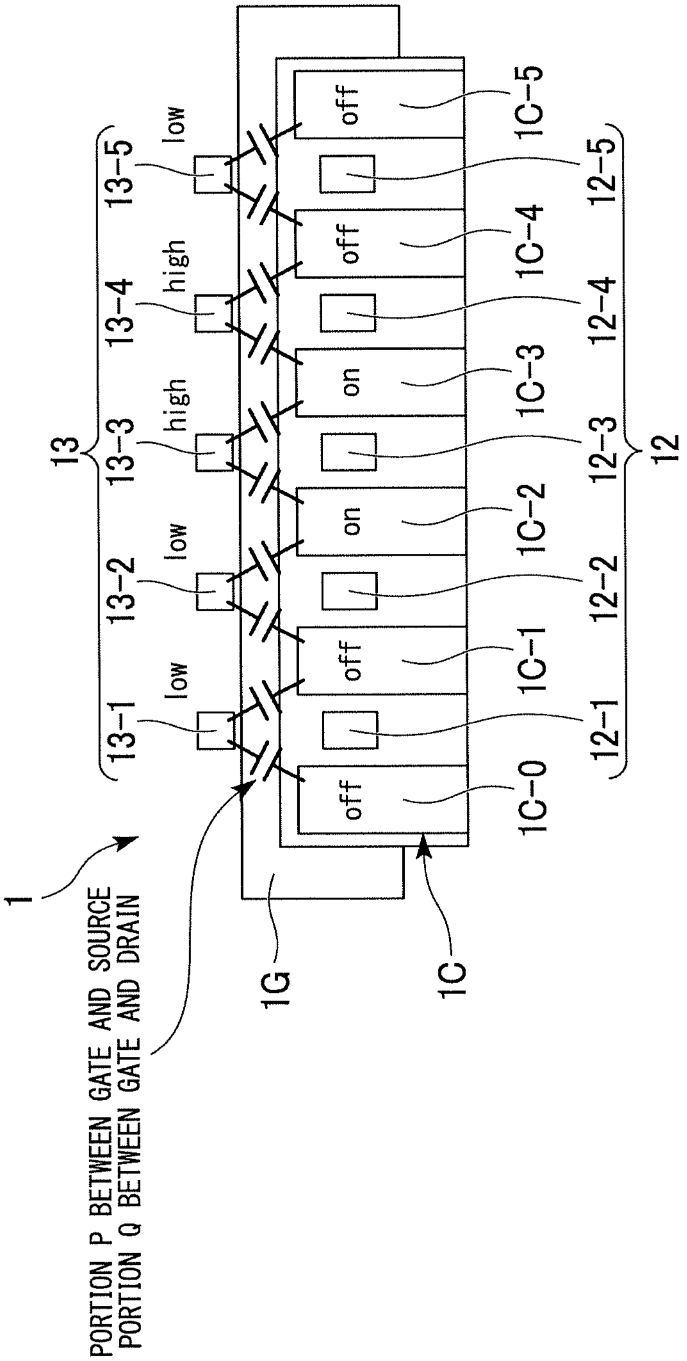
FIG. 14 is a diagram showing a second example of the quantum device of the ninth embodiment.

FIG. 14 is a diagram showing a second example of the quantum device 1 of the ninth embodiment.

In the example shown in FIG. 14, a parasitic capacitance between the quantum bit control current line 13-1 and the channel structure part 1C-0 and a parasitic capacitance between the quantum bit control current line 13-1 and the channel structure part 1C-1 are utilized, a parasitic capacitance between the quantum bit control current line 13-2 and the channel structure part 1C-1 and a parasitic capacitance between the quantum bit control current line 13-2 and the channel structure part 1C-2 are utilized, a parasitic capacitance between the quantum bit control current line 13-3 and the channel structure part 1C-2 and a parasitic capacitance between the quantum bit control current line 13-3 and the channel structure part 1C-3 is utilized, a parasitic capacitance between the quantum bit control current line 13-4 and the channel structure part 1C-3 and a parasitic capacitance between the quantum bit control current line 13-4 and the channel structure part 1C-4 are utilized, and a parasitic capacitance between the quantum bit control current line 13-5 and the channel structure part 1C-4 and a parasitic capacitance between the quantum bit control current line 13-5 and the channel structure part 1C-5 are utilized.

In the example shown in FIG. 14, the quantum bit control current lines 13-1, 13-2, and 13-5 are set to be low and the quantum bit control current lines 13-3 and 13-4 are set to be high. Additionally, the channel structure parts 1C-0, 1C-1, 1C-4, and 1C-5 are set to off, and the channel structure parts 1C-2 and 1C-3 are set to on.

Figure 15:
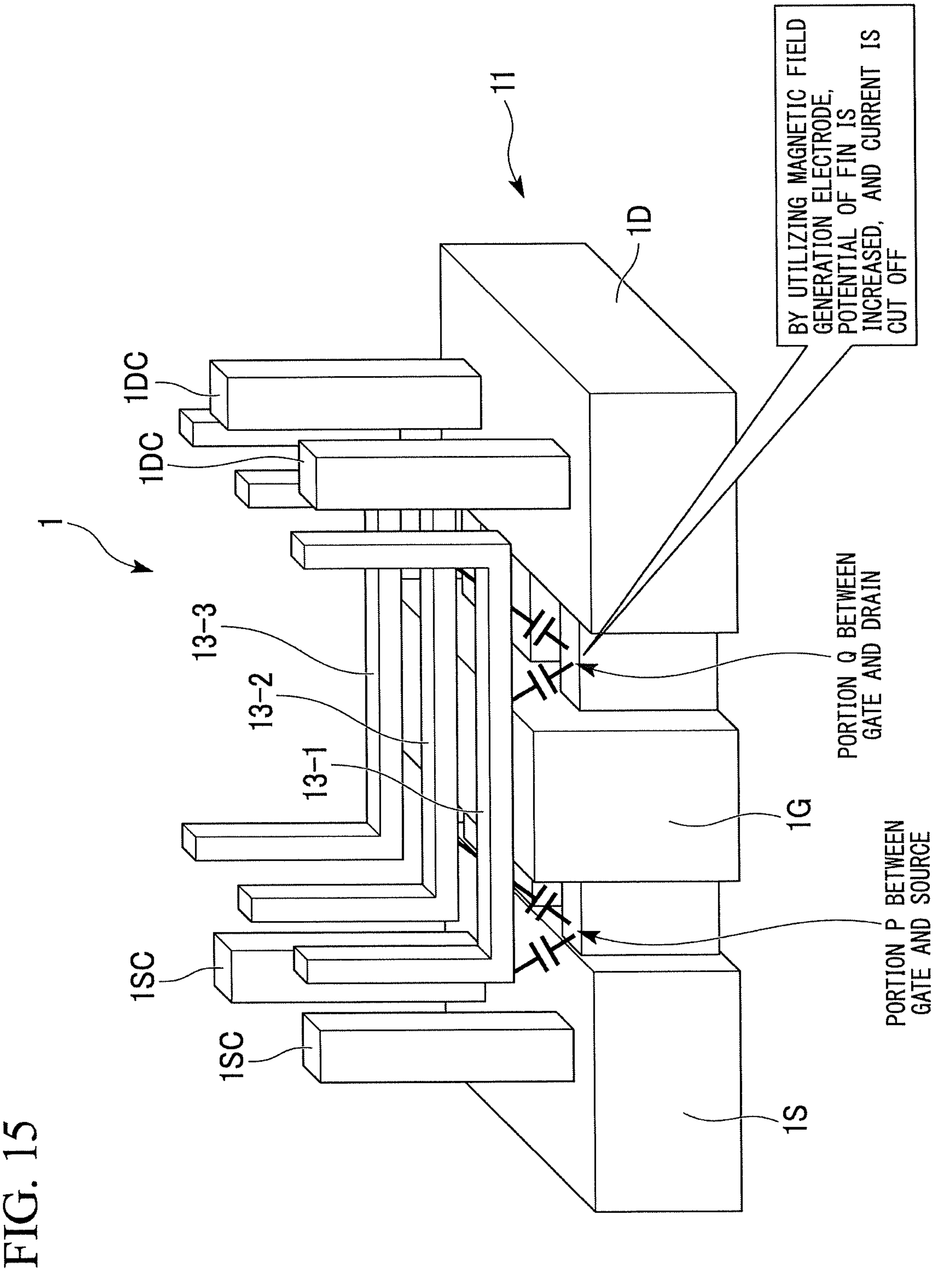
FIG. 15 is a diagram showing a third example of the quantum device of the ninth embodiment.

FIG. 15 is a diagram showing a third example of the quantum device 1 of the ninth embodiment.

In the example shown in FIG. 13, the quantum bit control current lines 13-1, 13-2, and 13-3 are linear, but in the example shown in FIG. 15, the quantum bit control current lines 13-1, 13-2, and 13-3 is bent. Also in the example shown in FIG. 15, magnetic field generation electrodes (quantum bit control current lines 13-1, 13-2, and 13-3) are utilized to increase the potential of FIN (the channel structure part of the transistor structure section 11), the current can be cut off.

Tenth Embodiment

A tenth embodiment of the quantum device of the present invention will be described below.

The quantum device 1 of the tenth embodiment is configured in the same manner as the quantum device 1 of the above-described first embodiment, except for points described below. Therefore, according to the quantum device 1 of the tenth embodiment, the same effects as those of the quantum device 1 of the above-described first embodiment can be obtained except for the points described below.

Figure 16:
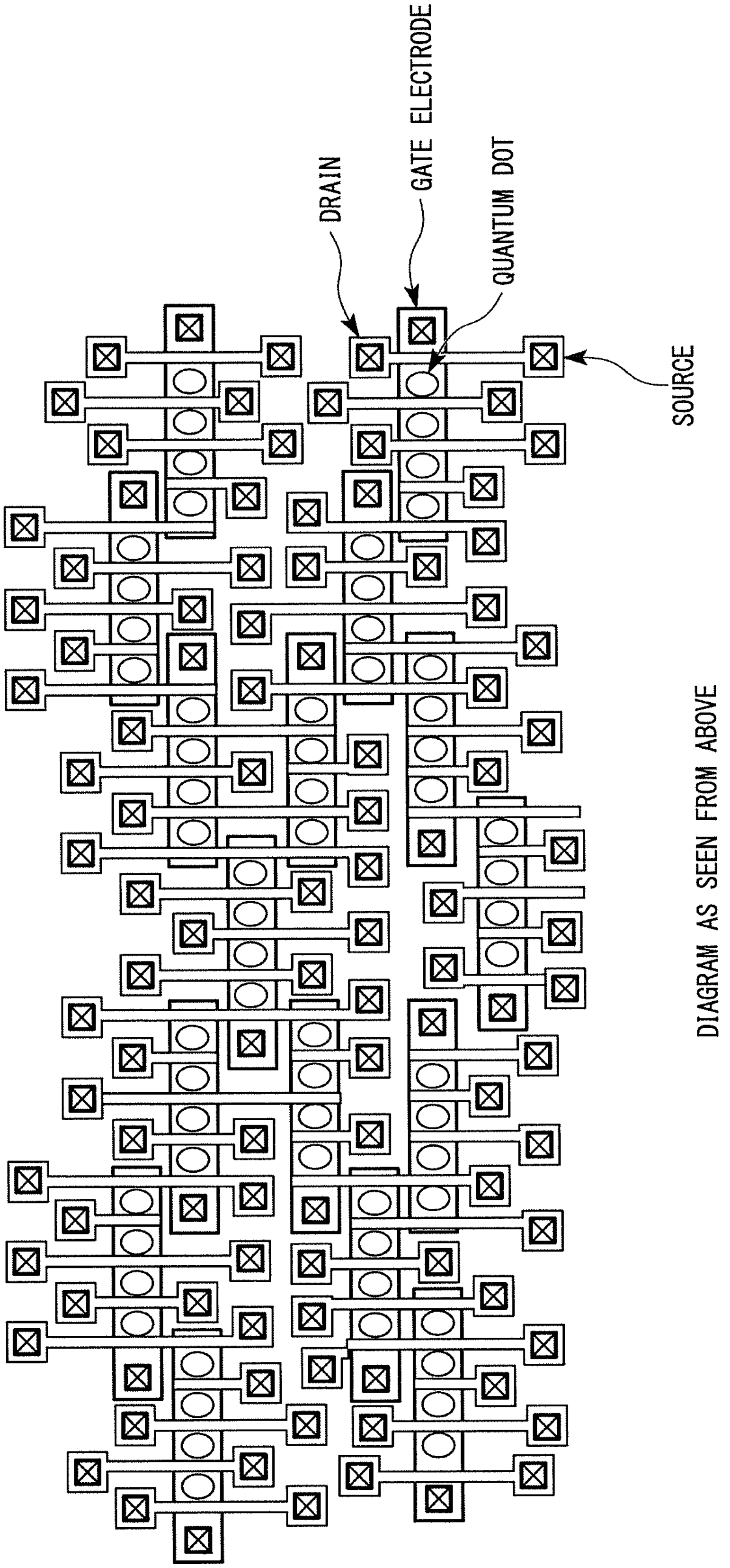
FIG. 16 is a diagram showing an example of a quantum device according to a tenth embodiment.

FIG. 16 is a diagram showing an example of the quantum device 1 of the tenth embodiment. Specifically, FIG. 16 is a plan view (two-dimensional layout) of an example of a configuration using a plurality of quantum devices 1 as shown in FIG. 1.

In order to perform the RKKY interaction between the quantum bits, it is necessary to make the positions of the quantum bits close to each other. In order to dispose the quantum bits two-dimensionally, in addition to disposing the quantum bits under the above-described common gate, as in the example shown in FIG. 16, a common channel is installed between different gates to connect vertical quantum bits to each other. As long as the quantum bits are connected to each other through the common channel, quantum operations can be performed by connecting two or more quantum bits to each other to perform, not limited to this example. Additionally, a three-dimensional structure may be adopted.

In the example shown in FIG. 16, the transistor structure section 11 having a plurality of channel structure parts 1C sandwiching the quantum dot structure section 12 is a multi-gate transistor.

That is, in the example shown in FIG. 16, the transistor structure section 11 has two or more gates as the gate 1G.

Eleventh Embodiment

An eleventh embodiment of the quantum device of the present invention will be described below.

The quantum device 1 of the eleventh embodiment is configured in the same manner as the quantum device 1 of the above-described first embodiment, except for points described below. Therefore, according to the quantum device 1 of the eleventh embodiment, the same effects as those of the quantum device 1 of the above-described first embodiment can be obtained except for the points described below.

Figure 17:
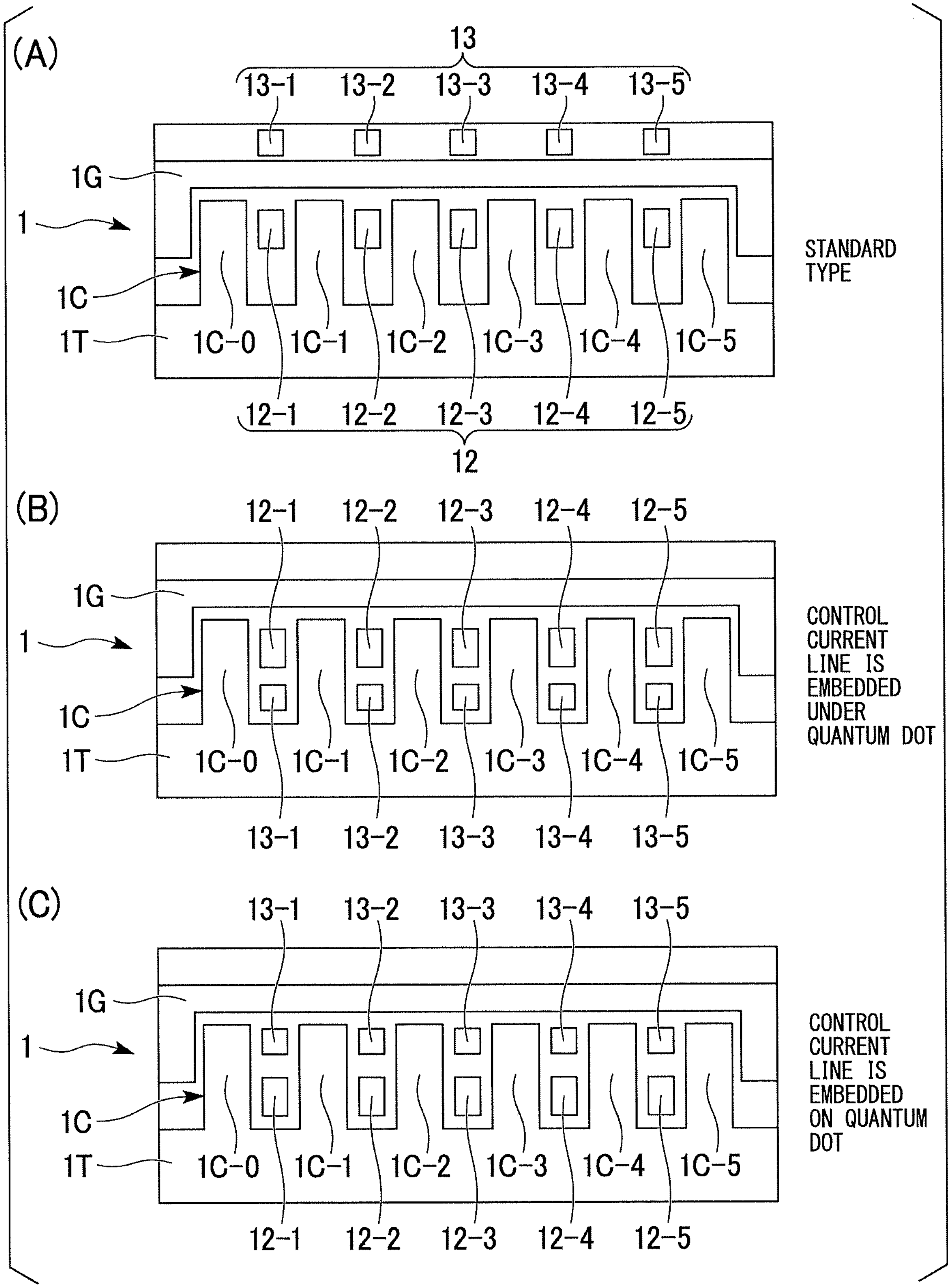
FIG. 17 is a diagram showing a first example of a quantum device according to an eleventh embodiment.

FIG. 17 is a diagram showing a first example and the like of the quantum device 1 of the eleventh embodiment. Specifically, (A) of FIG. 17 shows an example of the quantum device 1 of the first embodiment (similar to the example shown in (B) of FIG. 2), (B) of FIG. 17 shows a first example of the quantum device 1 of the eleventh embodiment, and (C) of FIG. 17 shows a second example of the quantum device 1 of the eleventh embodiment.

The electrode structures (quantum bit control current lines 13-1, 13-2, 13-3, 13-4, and 13-5) of the quantum device 1 can be embedded under quantum dots (quantum dot structure sections 12-1, 12-2, 12-3, 12-4, and 12-5) as shown in (B) of FIG. 17, though (A) of FIG. 17 installed on the common gate (gate 1G) is a basic system. In this case, it is easier to control the quantum bits by the quantum bit control current lines 13-1, 13-2, 13-3, 13-4, and 13-5. Additionally, as shown in (C) of FIG. 17, the quantum bit control current lines 13-1, 13-2, 13-3, 13-4, and 13-5 can be embedded on the quantum dots (quantum dot structure sections 12-1, 12-2, 12-3, 12-4, and 12-5). In this case, instead of reducing the influence of the gate electrode (gate 1G) on the quantum dots (quantum dot structure sections 12-1, 12-2, 12-3, 12-4, and 12-5), the tunneling intensity between the electrons of the inversion layers of the channels (channel structure parts 1C-1, 1C-2, 1C-3, and 1C-4) and the quantum dots (quantum dot structure sections 12-1, 12-2, 12-3, 12-4, and 12-5) is slightly weakened.

In the example shown in (B) of FIG. 17, the quantum bit control current lines 13 (13-1, 13-2, 13-3, 13-4, and 13-5) are disposed at positions closer to the substrate portion 1T than the quantum dot structure sections 12 (12-1, 12-2, 12-3, 12-4, and 12-5).

Figure 18:
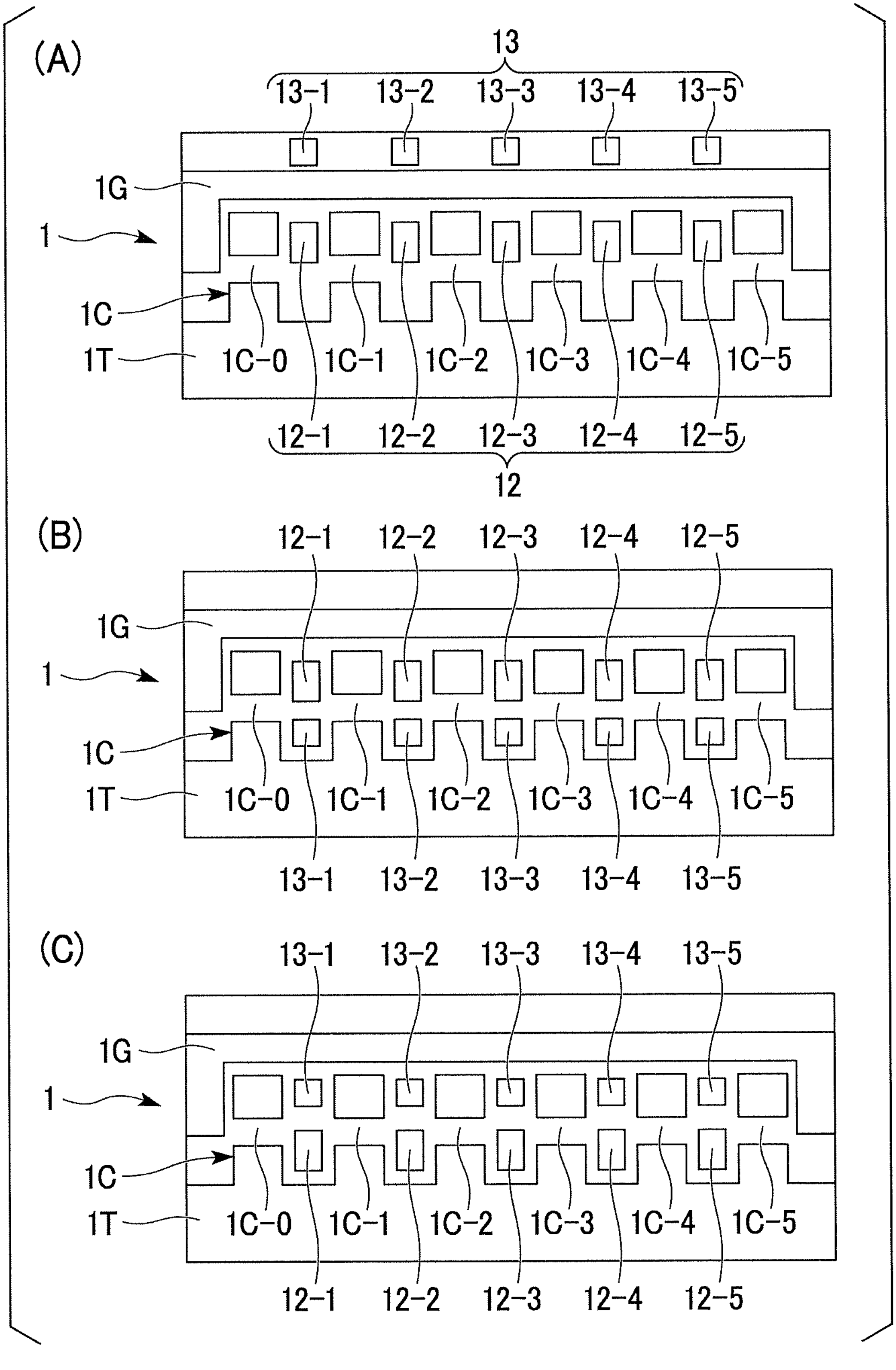
FIG. 18 is a diagram showing a third example of the quantum device of the eleventh embodiment.

FIG. 18 is a diagram showing a third example and the like of the quantum device 1 of the eleventh embodiment. Specifically, (A) of FIG. 18 shows the third example of the quantum device 1 of the eleventh embodiment, (B) of FIG. 18 shows a fourth example of the quantum device 1 of the eleventh embodiment, and (C) of FIG. 18 shows a fifth example of the quantum device 1 of the eleventh embodiment.

FIG. 18 shows an example in a case where the quantum device 1 is applied to a nanowire structure used as an advanced form of the FINFET structure. Although a two-stage nanowire structure is described herein, the same applies to three or more nanowire structures.

That is, in the examples shown in (A) to (C) of FIG. 18, the channel structure part 1C-0 is composed of a two-stage nanowire structure, the channel structure part 1C-1 is composed of a two-stage nanowire structure, the channel structure part 1C-2 is composed of a two-stage nanowire structure, the channel structure part 1C-3 is composed of a two-stage nanowire structure, and the channel structure part 1C-4 is composed of a two-stage nanowire structure, the channel structure part 1C-5 is composed of a two-stage nanowire structure.

In the example shown in (A) of FIG. 18, a part (upper stage) of each two-stage nanowire structure is coupled with a quantum bit. In the example shown in (B) of FIG. 18, current lines (quantum bit control current lines 13-1, 13-2, 13-3, 13-4, and 13-5) are installed next to lower-stage nanowire structures. In the example shown in (C) of FIG. 18, wiring lines of magnetic field control lines (quantum bit control current lines 13-1, 13-2, 13-3, 13-4, and 13-5) are installed on the same layer (the same height in (C) of FIG. 18) as the upper-stage nanowire structures, and quantum dots (quantum dot structure sections 12-1, 12-2, 12-3, 12-4, and 12-5) are mainly embedded between the lower-stage nanowire structures.

Twelfth Embodiment

A twelfth embodiment of the quantum device of the present invention will be described below.

The quantum device 1 of the twelfth embodiment is configured in the same manner as the quantum device 1 of the above-described first embodiment, except for points described below. Therefore, according to the quantum device 1 of the twelfth embodiment, the same effects as those of the quantum device 1 of the above-described first embodiment can be obtained except for the points described below.

FIG. 19 is a diagram showing an example of the quantum device 1 of the twelfth embodiment.

In the example shown in FIG. 1, one quantum dot structure section 12-1 is sandwiched between the channel structure parts 1C-0 and 1C-1, one quantum dot structure section 12-2 is sandwiched between the channel structure parts 1C-1 and 1C-2, one quantum dot structure section 12-3 is sandwiched between the channel structure parts 1C-2 and 1C-3, one quantum dot structure section 12-4 is sandwiched between the channel structure parts 1C-3 and 1C-4, and one quantum dot structure section 12-5 is sandwiched between channel structure parts 1C-4 and 1C-5.

On the other hand, in the example shown in FIG. 19, two quantum dot structure sections 12-1 are sandwiched between the channel structure parts 1C-0 and 1C-1, two quantum dot structure sections 12-2 are sandwiched between the channel structure parts 1C-1 and 1C-2, two quantum dot structure sections 12-3 are sandwiched between channel structure parts 1C-2 and 1C-3, two quantum dot structure sections 12-4 are sandwiched between the channel structure parts 1C-3 and 1C-4, and two quantum dot structure sections 12-5 are sandwiched between the channel structure parts 1C-4 and 1C-5.

In the example shown in FIG. 19, two quantum dots (quantum dot structure sections 12-1, 12-2, 12-3, 12-4, and 12-5) of a quantum bit portion are arranged along each of channels (channel structure parts 1C-0, 1C-1, 1C-2, 1C-3, 1C-4, and 1C-5). When two quantum dots are arranged, the energy level between the two quantum dots takes a bonding orbital and an anti-bonding orbital like a molecule consisting of two elements. In this case, since it may not be necessary to apply the above-described external magnetic field, a quantum computer that is easier to control can be completed.

Thirteenth Embodiment

A thirteenth embodiment of the quantum device of the present invention will be described below.

The quantum device 1 of the thirteenth embodiment is configured in the same manner as the quantum device 1 of the above-described first embodiment, except for points described below. Therefore, according to the quantum device 1 of the thirteenth embodiment, the same effects as those of the quantum device 1 of the above-described first embodiment can be obtained except for the points described below.

Figure 20:
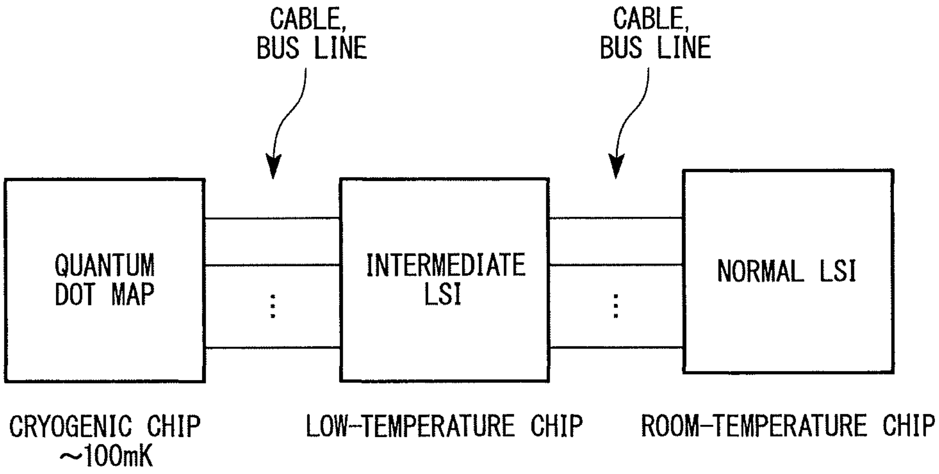
FIG. 20 is a diagram showing an application example of a quantum device of a thirteenth embodiment.

FIG. 20 is a diagram showing an application example of the quantum device 1 of the thirteenth embodiment.

In the example shown in FIG. 20, a quantum bit chip (quantum bit portion) serving as the quantum device 1 of the thirteenth embodiment is put in a cryogenic refrigerator. The example shown in FIG. 20 is an example of a case where the quantum bit chip is finally operated by a room-temperature computer (usually LSI), and an intermediate low-temperature LSI portion (intermediate LSI) is an LSI that serves as a bridge between the quantum bit portion (quantum bit chip) and a normal computer portion (normal LSI). Here, the low temperature means, for example, about 4K to 77K.

Fourteenth Embodiment

A fourteenth embodiment of the quantum device of the present invention will be described below.

The quantum device 1 of the fourteenth embodiment is configured in the same manner as the quantum device 1 of the above-described first embodiment, except for points described below. Therefore, according to the quantum device 1 of the fourteenth embodiment, the same effects as those of the quantum device 1 of the above-described first embodiment can be obtained except for the points described below.

Figure 21:
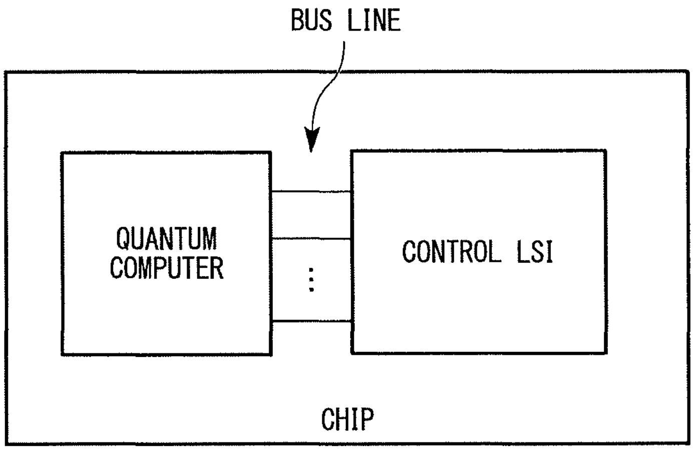
FIG. 21 is a diagram showing an application example of a quantum device of a fourteenth embodiment.
Figure 22:
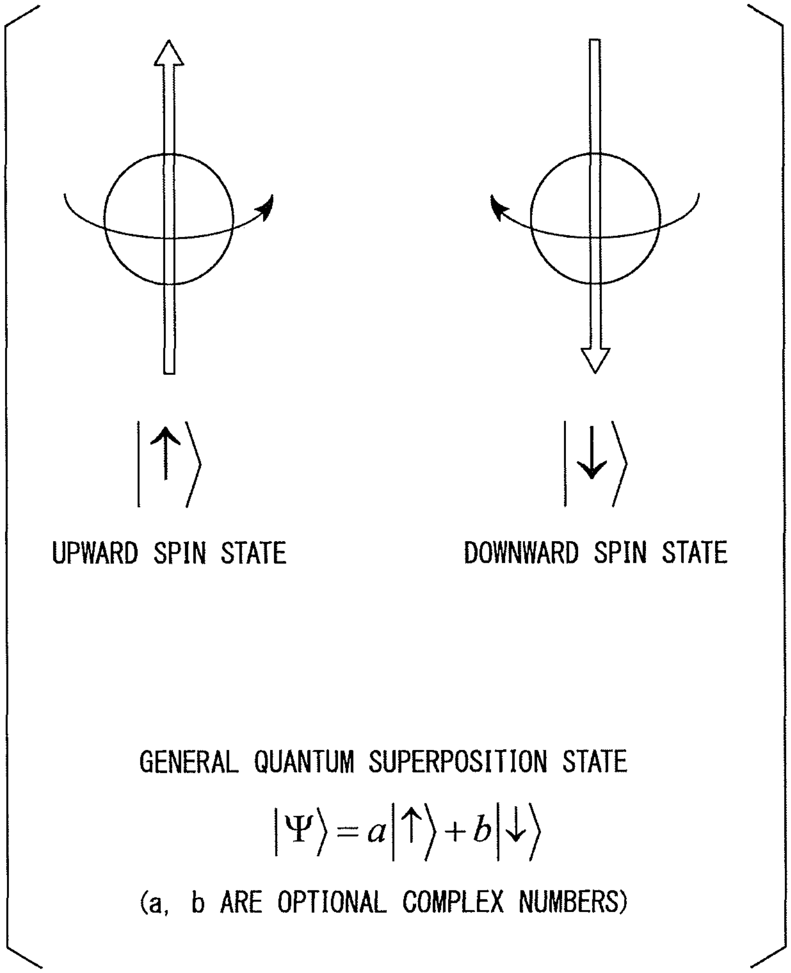
FIG. 22 is a schematic diagram of a simple spin quantum bit.

FIG. 21 is a diagram showing an application example of the quantum device 1 of the fourteenth embodiment.

In the example shown in FIG. 21, a quantum computer portion serving as the quantum device 1 of the fourteenth embodiment and a control circuit LSI portion (control LSI) are connected to each other by a bus line. In the quantum bit (quantum device 1) of the present invention, a normal transistor such as FINFET, which is used in smartphones and the like, is utilized. Therefore, as shown in FIG. 21, since mixing with a general LSI is possible, and the control of the quantum computer portion (quantum device 1) is often performed by normal LSI circuits, the circuits are connected to each other by a bus.

In each of the above-described examples, as techniques (order) in which a plurality of FIN portions and insulators and quantum dots (polysilicon) therebetween are made, there are, for example, a technique of making the insulators and the quantum dots (polysilicon) after the plurality of FIN portions is made, a technique of making the insulators and the quantum dots (polysilicon) in parallel while making the plurality of FIN portions (that is, making the FIN longer), a technique of combining the techniques with each other, and the like.

Fifteenth Embodiment

A fifteenth embodiment of the quantum device of the present invention will be described below.

The quantum device 1 of the fifteenth embodiment is configured in the same manner as the quantum device 1 of the above-described first embodiment, except for points described below. Therefore, according to the quantum device 1 of the fifteenth embodiment, the same effects as those of the quantum device 1 of the above-described first embodiment can be obtained except for the points described below.

Figure 24:
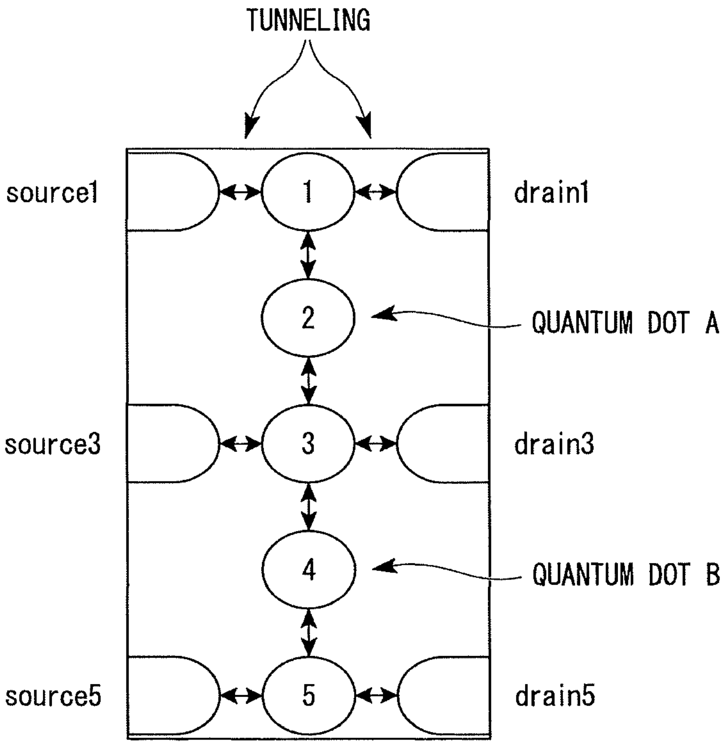
FIG. 24 is a diagram showing an example of a quantum device of a fifteenth embodiment.

FIG. 24 is a diagram showing an example of the quantum device 1 of the fifteenth embodiment.

In the example shown in FIG. 24, the quantum device 1 is made even smaller than the quantum device 1 in the example shown in FIG. 1. Specifically, in the example shown in FIG. 1, the normal FINFET is used for the quantum device 1, whereas in the example shown in FIG. 24, the conduction channel portion of the normal FINFET is used as a new quantum device.

That is, in the example shown in FIG. 24, the conduction channel IC becomes even smaller than that of the normal FINFET, and a portion surrounded by the source and drain of the channel also becomes a quantum dot.

FIG. 24 shows two quantum dots and three conduction channels surrounding the two quantum dots.

In the example shown in FIG. 24, micronization is advanced further than the nanowire type shown in FIG. 23.

In FIG. 24, (source 1, quantum dot 1, drain 1), (source 3, quantum dot 3, drain 3), and (source 5, quantum dot 5, drain 5) each represent a state in which the normal FINFET becomes smaller.

Sixteenth Embodiment

A sixteenth embodiment of the quantum device of the present invention will be described below.

The quantum device 1 of the sixteenth embodiment is configured in the same manner as the quantum device 1 of the above-described first embodiment, except for points described below. Therefore, according to the quantum device 1 of the sixteenth embodiment, the same effects as those of the quantum device 1 of the above-described first embodiment can be obtained except for the points described below.

Figure 25:
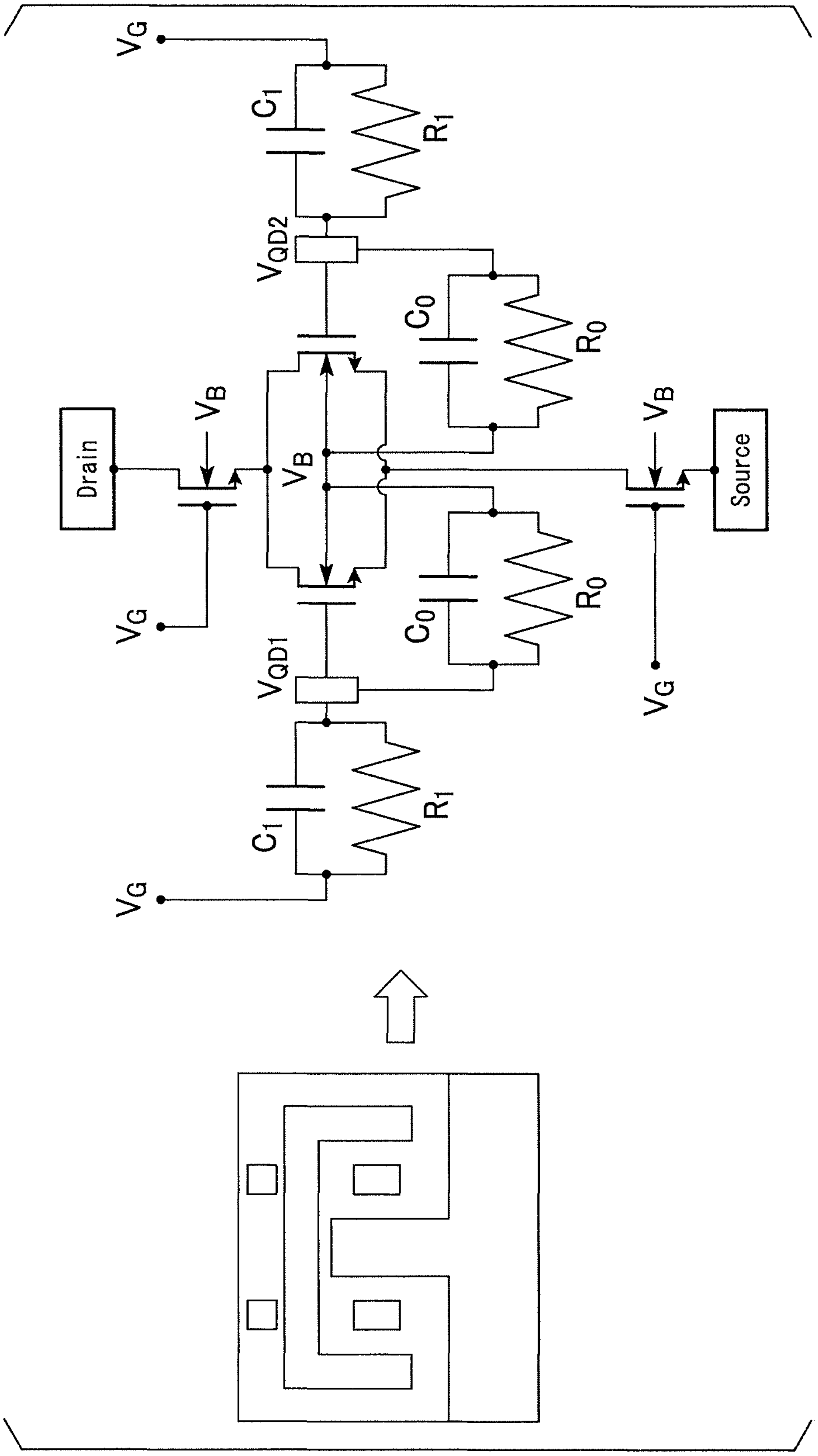
FIG. 25 is a diagram showing an example of an equivalent circuit of a sixteenth embodiment.

FIG. 25 is a diagram showing an example of the quantum device 1 of the sixteenth embodiment.

In the example shown in FIG. 25, the channel portion and the two quantum dot portions as shown in FIG. 4 are described as a circuit simulator. Specifically, the quantum dot portions are described as floating gates and the channel portion is described as two transistors.

Although the embodiments of the present invention have been described above in detail with reference to the drawings, the specific configuration is not limited to the embodiments, and modifications can be made appropriately without departing from the scope of the present invention. The configurations described in the above-described respective embodiments and respective examples may be combined.

REFERENCE SIGNS LIST

1: Quantum device
11: Transistor structure section
1S, 1S-1, 1S-2, 1S-3: Source
1SC, 1SC-1, 1SC-2, 1SC-3: Source electrode
1D, 1D-1, 1D-2, 1D-3: Drain
1DC: Drain electrode1G: Gate
1C, 1C-0, 1C-1, 1C-2, 1C-3, 1C-4, 1C-5, 1C-6: Channel structure part
1T: Substrate portion
12, 12-1, 12-2, 12-3, 12-4, 12-5, 12-6: Quantum dot structure section
13, 13-1, 13-2, 13-3, 13-4, 13-5, 13-6: Quantum bit control current line

What is claimed is:

1. A quantum device comprising:
a transistor structure section having a source, a drain, and a gate and having a plurality of channel structure parts between the source and the drain; and
one or more quantum dot structure sections,
wherein:
the quantum dot structure section is sandwiched between the plurality of channel structure parts,
an electron or a hole is storable in the quantum dot structure section, and
the quantum device further includes a quantum bit control current line through which a quantum bit control current flows, which generates a magnetic field that controls a spin state of the electron or the hole.

2. The quantum device according to claim 1, wherein the transistor structure section having the plurality of channel structure parts sandwiching the quantum dot structure section is a multi-gate transistor.

3. The quantum device according to claim 1, wherein the gate is disposed on any one of an upper portion, a lateral side, and a lower side of the channel structure part.

4. The quantum device according to claim 1, wherein the transistor structure section has two or more gates as the gate.

5. The quantum device according to claim 1, wherein:
the transistor structure section has a substrate portion, and
the quantum bit control current line is disposed at a position closer to the substrate portion than the quantum dot structure section.

6. The quantum device according to claim 1, further comprising at least a first quantum dot structure section and a second quantum dot structure section as the quantum dot structure section,
wherein:
the plurality of channel structure parts include a first channel structure part disposed between the first quantum dot structure section and the second quantum dot structure section, and
a magnetic field generated by allowing the quantum bit control current to flow through the quantum bit control current line is utilized to change a quantum state of a charge spin in the first quantum dot structure section to adopt an interaction between the charge spin in the first quantum dot structure section and a charge spin in the second quantum dot structure section as an indirect interaction via a charge in the first channel structure part.

7. The quantum device according to claim 6, wherein:
the quantum device has a manipulation mode, and
in the manipulation mode, a current of the quantum bit control current line is set to a non-zero value, a voltage of the gate is set to a value greater than zero, a voltage of the source is set to a non-zero value, and a voltage of the drain is set to a non-zero value, a magnetic field generated by at least the quantum bit control current line is set to a non-zero value, and a Ruderman-Kittel-Kasuya-Yosida (RKKY) interaction is utilized.

8. The quantum device according to claim 7, wherein:
the quantum device has a measurement mode, and
in the measurement mode, the voltage of the gate is set to a value greater than zero, the voltage of the source is set to a value less than the voltage of the drain, and a state of a charge spin in the quantum dot structure section is estimated on the basis of a current between the source and the drain.

9. The quantum device according to claim 1, wherein:
a fact that a charge spin in the quantum dot structure section has a different energy level depending on a state of a charge in the quantum dot structure section is utilized, and
a state of the charge spin in the quantum dot structure section sandwiched between a first channel structure part and a second channel structure part included in the plurality of channel structure parts is estimated on the basis of a measured value of a current between the source and the drain, which flows through the first channel structure part.

10. The quantum device according to claim 1, wherein:
the quantum dot structure section is naturally or artificially produced, and
an energy level of the quantum dot structure section is a trap level.

* * * * *